(12) United States Patent
Kato

(10) Patent No.: US 7,638,845 B2
(45) Date of Patent: Dec. 29, 2009

(54) SEMICONDUCTOR DEVICE WITH BURIED CONDUCTIVE LAYER

(75) Inventor: Juri Kato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 427 days.

(21) Appl. No.: 11/535,741

(22) Filed: Sep. 27, 2006

(65) Prior Publication Data

US 2007/0080402 A1 Apr. 12, 2007

(30) Foreign Application Priority Data

| Oct. 3, 2005 | (JP) | ............................. 2005-289671 |
| Nov. 28, 2005 | (JP) | ............................. 2005-341436 |
| Jul. 11, 2006 | (JP) | ............................. 2006-190232 |

(51) Int. Cl.
*H01L 29/786* (2006.01)

(52) U.S. Cl. .............................. 257/349; 257/E29.275; 257/E21.637

(58) Field of Classification Search ................. 257/315, 257/349, E29.275, E21.623, E21.637
See application file for complete search history.

(56) References Cited

U.S. PATENT DOCUMENTS

| 5,717,324 A | 2/1998 | Tobita |
| 5,726,941 A | 3/1998 | Tobita |
| 5,812,015 A | 9/1998 | Tobita |
| 5,815,446 A | 9/1998 | Tobita |
| 5,929,479 A | 7/1999 | Oyama |
| 6,054,734 A * | 4/2000 | Aozasa et al. ................ 257/315 |
| 6,423,599 B1 * | 7/2002 | Yu ............................... 438/283 |
| 6,596,570 B2 | 7/2003 | Furukawa |
| 6,800,513 B2 | 10/2004 | Horiuchi et al. |
| 7,009,251 B2 | 3/2006 | Furukawa |
| 7,323,370 B2 | 1/2008 | Furukawa |
| 2002/0175328 A1 * | 11/2002 | Tsunoda et al. ............... 257/59 |
| 2008/0006901 A1 | 1/2008 | Furukawa |

FOREIGN PATENT DOCUMENTS

| CN | 1159656 A | 9/1997 |
| CN | 1516903 A | 7/2004 |
| JP | A 9-45909 | 2/1997 |
| JP | A 9-205211 | 8/1997 |
| JP | A 2000-124092 | 4/2000 |
| JP | A 2002-299591 | 10/2002 |
| KR | 2003-0051212 A | 6/2003 |

OTHER PUBLICATIONS

T. Sakai et al., "Separation by Bonding Si Islands (SBSI) for LSI Applications," Second Internationl SiGe Technology and Device Meeting Abstract, SBSI Technology, pp. 230-231, May 2004.

* cited by examiner

*Primary Examiner*—Jerome Jackson, Jr.
*Assistant Examiner*—Paul A Budd
(74) *Attorney, Agent, or Firm*—Oliff & Berridge, PLC

(57) ABSTRACT

A semiconductor device includes a first insulator formed at a part under a semiconductor layer, a second insulator formed under the semiconductor layer in an arranged manner avoiding the first insulator and having a relative dielectric constant different from that of the first insulator, a backgate electrode formed under the first and second insulators, a gate electrode formed on the semiconductor layer, and a source layer and a drain layer formed in the semiconductor layer to be respectively arranged on opposite lateral sides of the gate electrode.

18 Claims, 26 Drawing Sheets

SEMICONDUCTOR DEVICE WITH BURIED CONDUCTIVE LAYER

BACKGROUND

1. Technical Field

The present invention relates to a semiconductor device and a method for manufacturing the same. In particular, the invention is suitably applied to a method for forming a field-effect transistor having a backgate electrode.

2. Related Art

Much attention is given to the usefulness of a field-effect transistor formed on a silicon-on-insulator (SOI) substrate due to the easiness of device separation, latch-up free operation, a small amount of source and drain junction capacitance and the like. In particular, a fully-depleted SOI transistor can exhibit low power consumption and high-speed performance, while operating at low voltage. Accordingly, research has been actively conducted to develop SOI transistors operating in a fully-depleted mode. In this case, an SOI substrate is formed of, for example, a separation by implanted oxygen (SIMOX) substrate, a bonding substrate or the like, as disclosed in first and second patent examples of related art provided below.

Additionally, a previous semiconductor device manufacturing method has provided a field-effect transistor having a high breakdown voltage, in which a backgate electrode is formed on an insulating film covering the field-effect transistor and connected to a gate or a source, as described in third and fourth patent examples of the related art below.

Furthermore, a non-patent example of the related art below has disclosed a method for forming an SOI transistor at a low cost by forming an SOI layer on a bulk substrate. In this method, Si/SiGe layers are film-formed on an Si substrate and only the SiGe layer is selectively removed by taking advantage of a difference in etch selectivity ratio between Si and SiGe. Thereby, a cavity is formed between the Si substrate and the Si layer. Then, thermal oxidation of Si exposed in the cavity is performed to bury an $SiO_2$ layer between the Si substrate and the Si layer, whereby a buried oxide (BOX) layer is formed therebetween.

Here, in order to enable both high-speed performance and low power consumption of a field-effect transistor while attaining miniaturization thereof, there is a method for forming an SOI transistor having a backgate structure or a double gate structure.

JP-A-2002-299591 is a first example of the related art.
JP-A-2000-124092 is a second example of the related art.
JP-A-9-45909 is a third example of the related art.
JP-A-9-205211 is a fourth example of the related art.

"Separation by Bonding Si Islands (SBSI) for LSI Application" (by T. Sakai et al., Second International GiGe Technology and Device Meeting, Meeting Abstract, pp. 230-231, May 2004) is a non-patent example of the related art.

In previous semiconductor integrated circuits, however, reduction in channel length due to transistor miniaturization deteriorates drain-current rising characteristics in a sub-threshold region. This hinders low-voltage operation of a transistor, and increases leakage current during an off-time period thereof and its operating and standby power consumption. Moreover, the deterioration even leads to destruction of the transistor.

Furthermore, there is a problem that arrangement of a backgate electrode on an entire surface region under a field-effect transistor increases parasitic capacitance between the backgate electrode and source and drain layers, thereby hindering high-speed performance of the SOI transistor.

SUMMARY

Accordingly, an advantage of the present invention is to provide a semiconductor device capable of improving threshold controllability by using a backgate electrode and reducing parasitic capacitance between the backgate electrode and source and drain layers, as well as to provide a method for manufacturing the semiconductor device.

In view of the problems described above, a semiconductor device according to a first aspect of the invention includes a first insulator formed at a part under a semiconductor layer, a second insulator formed under the semiconductor layer in an arranged manner avoiding the first insulator and having a relative dielectric constant different from that of the first insulator, a backgate electrode formed under the first and second insulators, a gate electrode formed on the semiconductor layer, and a source layer and a drain layer formed in the semiconductor layer to be respectively arranged on opposite lateral sides of the gate electrode.

In this manner, the backgate electrode can be arranged under the gate electrode and can also be coupled to a channel region via a high-dielectric material. Furthermore, the backgate electrode can be coupled to the source and drain layers via a low dielectric material. Consequently, parasitic capacitance between the backgate electrode and the substrate can be reduced while increasing coupling capacitance between the backgate electrode and the channel region. Accordingly, without restriction by arrangements of the gate electrode, source and drain contacts, etc., the backgate electrode can be arranged and also threshold controllability by the backgate electrode can be improved. As a result, transistor operating and standby power consumption can be reduced and high-speed performance of the SOI transistor can be achieved.

In addition, the semiconductor device according to the first aspect of the invention may further include a wiring layer for connecting the backgate electrode to the gate electrode.

In this manner, control can be performed such that the backgate electrode has the same potential as that of the gate electrode, thereby enhancing controllability to the potential of a deep part in the channel region. Accordingly, while suppressing an increase in chip size, an off-time leakage current and also operating and standby power consumption can be reduced. Moreover, the field-effect transistor can have a high breakdown voltage.

In addition, a semiconductor device according to a second aspect of the invention includes a semiconductor layer arranged on a semiconductor substrate to be film-formed by epitaxial growth, a first buried insulator buried in a part between the semiconductor substrate and the semiconductor layer, a second buried insulator buried between the semiconductor substrate and the semiconductor layer in an arranged manner avoiding the first buried insulator and having a relative dielectric constant different from that of the first buried insulator, a gate electrode formed on the semiconductor layer, and a source layer and a drain layer formed in the semiconductor layer to be respectively arranged on opposite lateral sides of the gate electrode.

In this manner, it is possible to enhance the degree of freedom in the arrangement of the backgate electrode. Thus, without restriction by the arrangement of the gate electrode, source and drain contacts, etc., the backgate electrode can be arranged at a part where electric field concentration occurs. Consequently, the field-effect transistor can be designed more freely and also can have high-voltage characteristics.

Additionally, the arrangement of the backgate electrode under a back surface side of the semiconductor layer allows a drain potential to be shielded by the backgate electrode. Thus, even when the drain potential is supplied from an Si thin-film surface of the SOI transistor, it can be prevented that a high voltage is applied to a drain offset layer and an interface between a high-concentration impurity diffusion layer and a buried oxide film. This consequently can prevent occurrence of a locally intense electric field in those areas, so that the SOI transistor can have high voltage characteristics.

Furthermore, since the backgate electrode can control the active-region potential in the SOI transistor, drain current rising characteristics in the subthreshold region can be improved and also concentration of electric fields at a drain channel end can be alleviated. Consequently, low-voltage operation of the transistor can be achieved, whereas leakage current during the off-time period can be reduced. Therefore, transistor operating and standby power consumption can be reduced, as well as the SOI transistor can have a high breakdown voltage.

Furthermore, the backgate electrode can be coupled to the channel region via a high dielectric material. In addition, the backgate electrode can be coupled to the source and drain layers via a low dielectric material. This can reduce parasitic capacitance between the backgate electrode and the substrate, while increasing coupling capacitance between the backgate electrode and the channel region. Consequently, threshold controllability by the backgate electrode can be improved and thereby the transistor operating and standby power consumption can be reduced. Moreover, the SOI transistor can exhibit high-speed performance.

Furthermore, in the semiconductor device according to the second aspect of the invention, the first buried insulator may be arranged under the gate electrode, whereas the second buried insulator may be arranged under the source and drain layers, and the first buried insulator may have a relative dielectric constant greater than that of the second buried insulator.

In this manner, parasitic capacitance between the backgate electrode and the substrate can be reduced while increasing coupling capacitance between the backgate electrode and the channel region. Thus, threshold controllability by the backgate electrode can be improved, whereby the transistor operating and standby power consumption can be reduced and the SOI transistor can exhibit high-speed performance.

In addition, a semiconductor device according to a third aspect of the invention includes a first semiconductor layer arranged on a semiconductor substrate to be film-formed by epitaxial growth, a second semiconductor layer arranged on the first semiconductor layer to be film-formed by epitaxial growth, a support member arranged so as to reach under the first and second semiconductor layers via sidewalls thereof to support the first and second semiconductor layers on the semiconductor substrate, a first buried insulator buried between the semiconductor substrate and the first semiconductor layer in an arranged manner avoiding the support member, a second buried insulator buried between the first and second semiconductor layers in an arranged manner avoiding the support member and having a relative dielectric constant greater than that of the support member, a gate electrode formed on the second semiconductor layer, and a source layer and a drain layer formed in the second semiconductor layer to be respectively arranged on opposite lateral sides of the gate electrode.

In this manner, even when the lower semiconductor layer is removed by taking advantage of a difference in etching rate between the semiconductor layers having mutually different compositions to form the buried insulators under the first and second semiconductor layers, it is possible to support the upper semiconductor layer not only from the sidewalls thereof but also from thereunder. It is also possible to make the relative dielectric constant of each of the buried insulators buried under the first and second semiconductor layers different between the ends and center thereof Thus, while suppressing bending of the first and second semiconductor layers constituting the field-effect transistor, each buried insulator can be formed under each of those layers. This can improve the uniformity of film thickness among the first and second semiconductor layers and the buried insulators. Moreover, the backgate electrode can be coupled to the channel region via the high dielectric material, whereas the backgate electrode can be coupled to the source and drain layers via the low dielectric material. Consequently, without using an SOI substrate, it is possible to uniformly form the SOI transistor on the semiconductor layer. Accordingly, a low-price SOI transistor capable of high-speed performance can be provided.

Additionally, a method for manufacturing a semiconductor device according to a fourth aspect of the invention includes film-forming a first semiconductor layer on a semiconductor substrate, film-forming a second semiconductor layer on the first semiconductor layer, the second semiconductor layer having an etching rate smaller than that of the first semiconductor layer, film-forming a third semiconductor layer on the second semiconductor layer, the third semiconductor layer having the same composition as that of the first semiconductor layer, film-forming a fourth semiconductor layer on the third semiconductor layer, the fourth semiconductor layer having the same composition as that of the second semiconductor layer, forming a first groove penetrating from the first semiconductor layer through the fourth semiconductor layer to expose the semiconductor substrate, removing a part of each of the first and third semiconductor layers under the second and fourth semiconductor layers by laterally etching the first and third semiconductor layers via the first groove, forming a support member arranged so as to reach under the second and fourth semiconductor layers via the first groove to support the second and fourth semiconductor layers on the semiconductor substrate, forming a second groove for exposing at least a part of each of the first and third semiconductor layers having the support member formed thereon from the second and fourth semiconductor layers, forming first and second cavities by removing the first and third semiconductor layers by selectively etching via the second groove, and forming a buried insulator buried in each of the first and second cavities via the second groove, the buried insulating layer having a relative dielectric constant greater than that of the support member.

In this manner, even when the second and fourth semiconductor layers, respectively, are laminated on the first and third semiconductor layers, it is possible to contact the first and third semiconductor layers with an etching liquid via the second groove. Thus, while leaving the second and fourth semiconductor layers, the first and third semiconductor layers can be removed. Additionally, the buried insulating layer can be formed to be buried in each of the first and second cavities under the second and fourth semiconductor layers. Furthermore, formation of the support member buried in the first groove allows the second and fourth semiconductor layers to be supported not only from the sidewalls thereof but from thereunder, even when the first and second cavities, respectively, are formed under the second and fourth semiconductor layers. Furthermore, it is possible to make a relative dielectric constant different between the ends and center of each of the second and fourth semiconductor layers.

Therefore, while reducing occurrence of defaults in the second and fourth semiconductor layers, the center of each of these semiconductor layers can be arranged on the buried insulating layer, as well as the edge of each thereof can be arranged on the support member. Consequently, while increasing coupling capacitance between the backgate electrode and the channel region, parasitic capacitance between the backgate electrode and the source and drain layers can be reduced. In addition, without using an SOI substrate, the SOI transistor can be formed on the fourth semiconductor layer. This can improve threshold controllability by the backgate electrode, while suppressing cost increase. As a result, transistor operating and standby power consumption can be reduced and the SOI transistor can exhibit high-speed performance.

Furthermore, in the method for manufacturing a semiconductor device according to the fourth aspect of the invention, the semiconductor substrate and the second and fourth semiconductor layers may be comprised of Si, whereas the first and third semiconductor layers may be comprised of SiGe.

In this manner, while obtaining a lattice match between the semiconductor substrate and the first through fourth semiconductor layers, it is possible to make etching rates of the first and third semiconductor layers greater than those of the semiconductor substrate, the second and fourth semiconductor layers. Consequently, the second and fourth semiconductor layers having good crystal quality, respectively, can be formed on the first and third semiconductor layers, respectively. Therefore, without damaging the quality of the second and fourth semiconductor layers, it is possible to obtain insulation between those semiconductor layers and the semiconductor substrate.

Additionally, a semiconductor device according to a fifth aspect of the invention includes a semiconductor layer formed on a semiconductor substrate by epitaxial growth, a buried conductive layer buried partially between the semiconductor substrate and the semiconductor layer to be sandwiched between upper and lower insulating layers, and a field-effect transistor formed at the semiconductor layer in such a manner that a channel is arranged above the buried conductive layer.

In this manner, without using an SOI substrate, it is possible to form an SOI transistor. Additionally, since the buried conductive layer is buried partially between the semiconductor substrate and the semiconductor layer, it is possible to arrange a backgate electrode under the channel in a manner avoiding the area under the source and drain layers of the SOI transistor. Accordingly, while suppressing the complexity of the manufacturing process, it is possible to control an active region potential of the SOI transistor by using the backgate electrode. This can improve drain-current rising characteristics in a subthreshold region. Additionally, even when the backgate electrode is arranged under the SOI transistor, an increase in parasitic capacitance on the source and drain layers can be suppressed. Consequently, while reducing cost increase, it is possible to increase a transistor on-current, and thus high-speed performance of the SOI transistor can be achieved. Furthermore, while allowing low-voltage operation of the transistor, leakage current during a transistor off-time period can be reduced. Therefore, transistor operating and standby power consumption can be reduced.

Furthermore, the semiconductor device according to the fifth aspect of the invention may further include a support member arranged so as to reach under the source and drain layers of the field-effect transistor in a manner sandwiching the buried conductive layer from both lateral sides thereof via sidewalls of the semiconductor layer to support the semiconductor layer on the semiconductor substrate.

In this manner, even when the cavity is formed under the semiconductor layer, it is possible to support the semiconductor layer not only from the sidewalls thereof layer but also from thereunder. In addition, the buried conductive layer can be buried partially between the semiconductor substrate and the semiconductor layer. Thus, while suppressing bending of the semiconductor layer, the buried conductive layer can be buried under the semiconductor layer, which can improve the uniformity of film thickness of the semiconductor layer. In addition, it is possible to arrange the buried conductive layer under the channel in a manner avoiding the area under the source and drain layers of the SOI transistor. As a result, without using an SOI substrate, the SOI transistor can be formed uniformly on the semiconductor layer. Moreover, while suppressing an increase in parasitic capacitance of the source and drain layers, the backgate electrode can control the active region potential of the SOI transistor. Thus, while a low-price SOI transistor can be formed, both high-speed performance and low power consumption can be achieved by the SOI transistor. Additionally, variations in transistor characteristics can be reduced.

Furthermore, in the semiconductor device according to the fifth aspect of the invention, the insulating layer may be a thermally-oxidized film, an oxynitride film or a high-K insulating film, whereas the buried conductive layer may be comprised of impurity-doped polycrystalline semiconductor, amorphous semiconductor, metal or alloy.

In this manner, the use of a versatile semiconductor manufacturing process such as a chemical-vapor deposition (CVD) enables the backgate electrode to be buried between the semiconductor substrate and the semiconductor layer, as well as it enables a reduction in resistance of the backgate electrode. Additionally, forming the insulating layer between the semiconductor layer and the conductive layer by thermal oxidation enables thin-film formation of the insulating layer therebetween, while controlling the film thickness thereof with high precision. Therefore, while suppressing the complexity of the manufacturing process, the backgate electrode can be arranged under the SOI transistor. Additionally, the backgate electrode can control threshold voltage of the SOI transistor at low voltage, which can reduce power consumption of the SOI transistor.

Furthermore, in the semiconductor device according to the fifth aspect of the invention, the buried conductive layer may have an extending portion extended in a width direction thereof longer than the gate electrode of the field-effect transistor, and also may have a backgate contact electrode connected to the buried conductive layer via the extending portion.

In this manner, even when the buried conductive layer is arranged under the field-effect transistor in a manner coincident with the channel region of the field-effect transistor, without obstruction by the gate electrode, it is possible to obtain contact with the buried conductive layer, and therefore potential of the buried conductive layer can be controlled externally.

Furthermore, in the semiconductor device according to the fifth aspect of the invention, the buried conductive layer may have a work function different from that of the gate electrode of the field-effect transistor.

In this manner, without restriction by arrangements of the gate electrode, the source and drain contacts, etc., the buried conductive layer can control the active region potential of the field-effect transistor. Thus, while suppressing the complexity of the manufacturing process, it is possible to improve the drain-current rising characteristics in the subthreshold region and alleviate concentration of electric fields at a drain-side channel end. As a result, low-voltage operation of the transistor can be achieved, whereas the off-time leakage current thereof can be reduced. Therefore, transistor operating and standby power consumption can be reduced and also the field-effect transistor can have a high breakdown voltage.

In addition, the work function is made different between the gate electrode formed on a top surface of the field-effect transistor and the buried conductive layer arranged thereunder. This can change a threshold voltage of the field-effect transistor by approximately a few volts, even when a body region of the semiconductor layer is intrinsically doped or doped at low concentration, the threshold voltage thereof can be changed by approximately a few volts. Regardless of the threshold voltage level, the semiconductor layer has a low dopant concentration. Therefore, this can enhance electron mobility of the field-effect transistor, thereby enabling on-current increase. Moreover, impurity concentration of the semiconductor layer can be reduced. Thus, even when the film thickness of the semiconductor layer increases, it is possible to obtain a sharp subthreshold slope, so that characteristic variations can be reduced. As a result, manufacturing yield can be improved, and thereby cost reduction can be achieved.

Furthermore, in the semiconductor device according to the fifth aspect of the invention, there may be a difference in a film thickness or a relative dielectric constant between the insulating layer and the gate insulating film of the field-effect transistor.

In this manner, while the buried conductive layer can be arranged under the field-effect transistor, coupling capacitance between the buried conductive layer and the channel region can be increased and parasitic capacitance between the buried conductive layer and the source and drain layers can be reduced. Thus, without restriction by arrangements of the gate electrode, the source and drain contacts, etc., the buried conductive layer can be arranged. In addition, threshold voltage controllability by the buried conductive layer can be enhanced, whereby operating and standby power consumption can be reduced and high-speed performance of the SOI transistor can be achieved. Moreover, forming the insulating layer comprised of a thin film of silicon oxide or silicon nitride having a thickness ranging from 1 to 20 nm or a high-K insulating film formed of an oxidized film of Al, Zr, Hr or the like can enhance threshold voltage controllability by the buried conductive layer and also can provide a favorable subthreshold.

Furthermore, the semiconductor device according to the fifth aspect of the invention may further include a wiring layer for electrically connecting the buried conductive layer to the gate electrode of the field-effect transistor.

In this manner, control can be provided such that a back surface side of the channel region of the field-effect transistor has the same potential as that of the gate electrode. This can enhance potential controllability of the channel region. Consequently, even in the case of a semiconductor layer having increased film thickness, a sharp subthreshold slope can be obtained. Therefore, while enabling a reduction in the transistor off-time leakage current, characteristic variations can also be reduced.

Furthermore, the semiconductor device according to the fifth aspect of the invention may further include a wiring layer for electrically connecting the source layer of the field-effect transistor to the buried conductive layer.

In this manner, potential of the buried conductive layer can be stabilized and also the field-effect transistor can have enhanced high-voltage characteristics. Consequently, a high voltage field-effect transistor can be provided.

Furthermore, the semiconductor device according to the fifth aspect of the invention may further include a wiring layer electrically connected to the buried conductive layer in a manner independent from the gate electrode and the source layer of the field-effect transistor.

In this manner, applying a voltage to the buried conductive layer allows a threshold value of the field-effect transistor to be controlled dynamically, whereby the threshold value can be changed during the operation of the field-effect transistor.

Furthermore, in the semiconductor device according to the fifth aspect of the invention, the buried conductive layer may be comprised of a material among polycrystalline semiconductor, amorphous semiconductor, silicide and metal, the material having N or P polarity, whereas the gate electrode of the field-effect transistor may be comprised of a material among polycrystalline semiconductor, amorphous semiconductor, silicide and a metal gate having a work function different from that of the buried conductive layer, the material having N or P polarity.

In this manner, combinations of the polarities and impurity concentrations of the buried conductive layer and the gate electrode enable adjustment of a threshold value of the field-effect transistor, while maintaining low channel impurity concentration. Accordingly, regardless of the threshold level, electron mobility of the field-effect transistor can be enhanced, thereby increasing the on-current. Additionally, even when the semiconductor layer is a thick film, a sharp subthreshold slope can be obtained and characteristic variations can be reduced.

In addition, a method of manufacturing a semiconductor device according to a sixth aspect of the invention includes forming a first semiconductor layer on a semiconductor substrate, forming a second semiconductor layer on the first semiconductor, the second semiconductor layer having an etching rate smaller than that of the first semiconductor layer, forming a first exposing portion for exposing the semiconductor substrate from the first and second semiconductor layers, removing a part of the first semiconductor layer under the second semiconductor layer by laterally etching the first semiconductor layer via the first exposing portion, forming a support member arranged so as to reach under the second semiconductor layer via the first exposing portion to support the second semiconductor layer on the semiconductor substrate, forming a second exposing portion for exposing a part of the first semiconductor layer from the second semiconductor layer, forming a cavity between the semiconductor substrate and the second semiconductor layer by removing the first semiconductor layer by selectively etching via the second exposing portion, forming an insulating film on each of upper and lower surfaces of the cavity and forming a buried conductive layer buried in the cavity so as to sandwich the buried conductive layer between the upper and lower insulating films.

In this method, the first semiconductor layer can be removed while leaving the second semiconductor layer, whereby the cavity can be formed under the second semiconductor layer. Additionally, covering the second semiconductor layer by the support member allows the second semiconductor layer to be supported on the semiconductor substrate, even in the case of formation of the cavity under the second semiconductor layer. Furthermore, arranging the exposing portion for exposing a part of the first semiconductor layer allows the first semiconductor layer to contact with an etching gas or liquid, even when the second semiconductor layer is laminated on the first semiconductor layer. Accordingly, it is possible to remove the first semiconductor layer while leaving the second semiconductor layer, as well as it is possible to form the buried conductive layer buried in the cavity so as to sandwich the buried conductive layer between the upper and lower insulating films. Still furthermore, forming the support member after laterally etching the first semiconductor layer via the first exposing portion allows the second semiconductor layer to be supported not from the side walls thereof but from thereunder, even when the cavity is formed under the second semiconductor layer. In addition, it allows the buried conductive layer to be buried partially between the semiconductor substrate and the second semiconductor layer. Accordingly, it is possible to arrange the second semiconductor layer above the buried conductive layer, while reducing the occurrence of defects of the second semiconductor layer. Thus, without damaging the quality of the second semiconductor layer, it is possible to achieve insulation between the second semiconductor layer and the semiconductor substrate. Additionally, while suppressing the complexity of the manufacturing process, the buried conductive layer can be arranged under the channel in a manner avoiding the area under the source and drain layers of the SOI transistor. Consequently, without using an SOI substrate, it is possible to uniformly form the SOI transistor on the semiconductor layer. Additionally, while suppressing an increase in the parasitic capacitance of the source and drain layers, an active region potential of the SOI transistor can be controlled by the backgate electrode. Accordingly, while achieving cost reduction of the SOI transistor, it is possible to simultaneously attain both high performance and low power consumption of the SOI transistor, as well as it is possible to reduce variations in transistor characteristics.

Furthermore, in the method of manufacturing a semiconductor device according to the sixth aspect of the invention, the semiconductor substrate and the second semiconductor layer may be comprised of Si, whereas the first semiconductor layer may be comprised of SiGe.

In this manner, it is possible to obtain a lattice match among the semiconductor substrate, the second and the first semiconductor layers, and it is also possible to make the etching rate of the first semiconductor layer greater than those of the semiconductor substrate and the second semiconductor layer. Accordingly, the second semiconductor layer having good crystal quality can be formed on the first semiconductor layer. Therefore, without damaging the quality of the second semiconductor layer, it is possible to achieve insulation between the second semiconductor layer and the semiconductor substrate.

Furthermore, in the method of manufacturing a semiconductor device according to the sixth aspect of the invention, the buried conductive layer buried in the cavity may be formed by using chemical vapor deposition.

In this manner, using the versatile semiconductor manufacturing process allows a backgate electrode to be formed between the semiconductor substrate and the semiconductor layer, while ensuring implantability of the conductive layer. Consequently, while suppressing the complexity of the manufacturing process, the backgate electrode can be arranged under the SOI transistor.

Furthermore, in the method of manufacturing a semiconductor device according to the sixth aspect of the invention, the formation of the buried conductive layer buried in the cavity may include depositing the conductive layer on an entire surface of the semiconductor substrate so as to bury an inside of the cavity and selectively removing the conductive layer on the semiconductor substrate while leaving the buried conductive layer under the second semiconductor layer by using at least isotropic etching or anisotropic etching.

In this manner, in order to bury the buried conductive layer in the cavity, even when the conductive layer is laminated on the entire surface of the semiconductor substrate, an unnecessary conductive layer can be removed while leaving the buried conductive layer in the cavity. Consequently, while suppressing the complexity of the manufacturing process, it is possible to arrange a backgate electrode under the SOI transistor.

Furthermore, in the method of manufacturing a semiconductor device according to the sixth aspect of the invention, the formation of the buried conductive layer buried in the cavity may include depositing the conductive layer on the entire surface of the semiconductor substrate so as to bury the inside of the cavity and removing the conductive layer on the semiconductor substrate while leaving the buried conductive layer under the second semiconductor layer by back-etching an entire surface of the conductive layer.

In this manner, in order to bury the buried conductive layer in the cavity, even when the conductive layer is laminated on the entire surface of the semiconductor substrate, simply back-etching the entire surface of the conductive layer simply allows the unnecessary conductive layer to be removed while leaving the buried conductive layer in the cavity. Consequently, while suppressing the complexity of the manufacturing process, it is possible to arrange the backgate electrode under the SOI transistor.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described according to its embodiments with reference to the accompanying drawings.

First Embodiment

FIGS. 1A, 2A, 3A, 4A, 5A, 6A, 7A, 8A, 9A, 10A, 11A and 12A are plan views showing a method for manufacturing a semiconductor device according to a first embodiment of the invention. FIGS. 1B, 2B, 3B, 4B, 5B, 6B, 7B, 8B, 9B, 10B, 11B and 12B are sectional views taken along lines A1-A1', A2-A2', A3-A3', A4-A4', A5-A5', A6-A6', A7-A7', A8-A8', A9-A9', A10-A10', A11-A11' and A12-A12', respectively, as shown in the above-mentioned figures. FIGS. 1C, 2C, 3C, 4C, 5C, 6C, 7C, 8C, 9C, 10C, 11C and 12C are sectional views taken along lines B1-B1', B2-B2', B3-B3', B4-B4', B5-B5', B6-B6', B7-B7', B8-B8', B9-B9', B10-B10', B11-B11' and B12-B12', respectively, as shown in the above-mentioned figures.

Figure 1A:
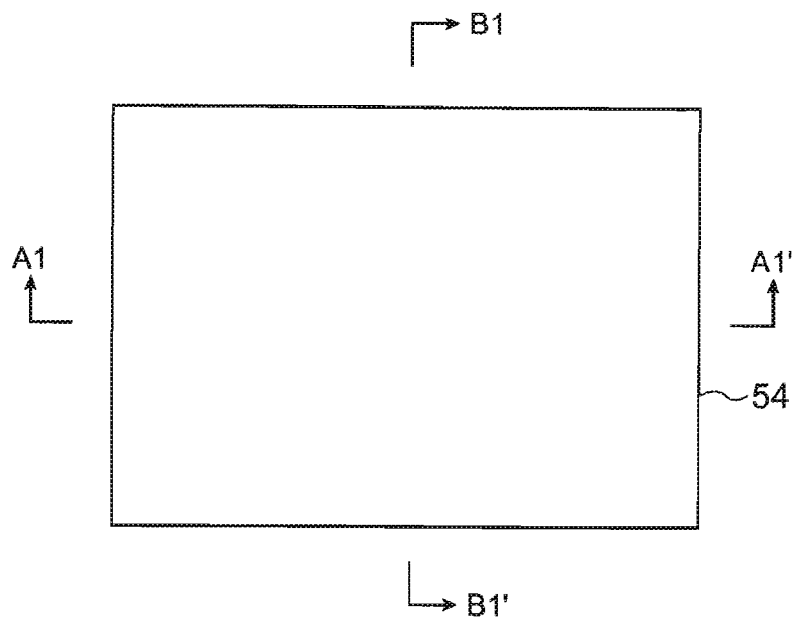
FIGS. 1A to 1C show a method for manufacturing a semiconductor device according to a first embodiment of the invention.
Figure 1B:
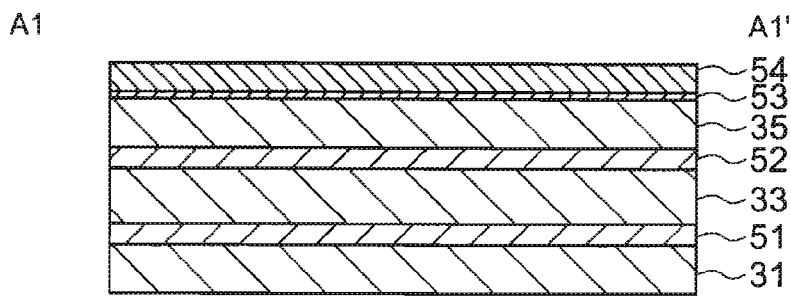
Figure 1C:
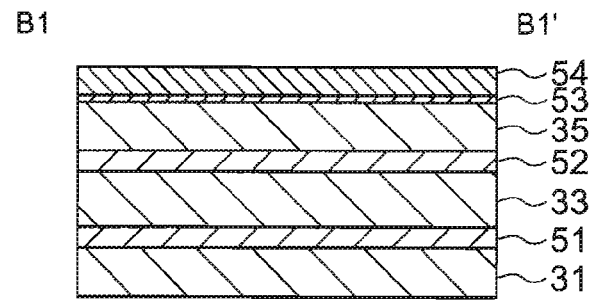

In FIGS. 1A to 1C, semiconductor layers 51, 33, 52 and 35 are sequentially laminated in this order on a semiconductor substrate 31. The semiconductor layers 51 and 52 may be made of material having an etching rate greater than that of the semiconductor substrate 31 and the semiconductor layers 33 and 35. Materials of the semiconductor substrate 31 and the semiconductor layers 33, 35, 51 and 52 may be, for example, selected as suitable from Si, Ge, SiGe, GaAs, InP, GaP, GaN, SiC and the like. In particular, when the semiconductor substrate 31 is made of Si, it is preferable to use SiGe as the material of the semiconductor layers 51 and 52, and Si as that of the semiconductor layers 33 and 35. In this manner, while obtaining a lattice match between the semiconductor layers 51, 52 and the semiconductor layers 33, 35, it is possible to ensure a selectivity ratio therebetween. Alternatively, material of the semiconductor layers 51, 33, 52 and 35 may be a single crystal semiconductor layer, a polycrystalline semiconductor layer, an amorphous semiconductor layer or a porous semiconductor layer. Furthermore, instead of the semiconductor layers 51 and 52, as a semiconductor layer, it may be possible to use a film of a metal oxide such as gamma-aluminum oxide, which can be film-formed by epitaxial growth. Additionally, the semiconductor layers 51, 33, 52 and 35 may have a film thickness ranging from approximately 1 to 100 nm, for example.

Then, a base oxide film 53 is formed on a surface of the semiconductor layer 35 by thermally oxidizing the semiconductor layer 35. Next, using a method such as CVD, an antioxidant film 54 is formed on an entire surface of the base oxide film 53. For example, the antioxidant film 54 may be a silicon nitride film.

Figure 2A:
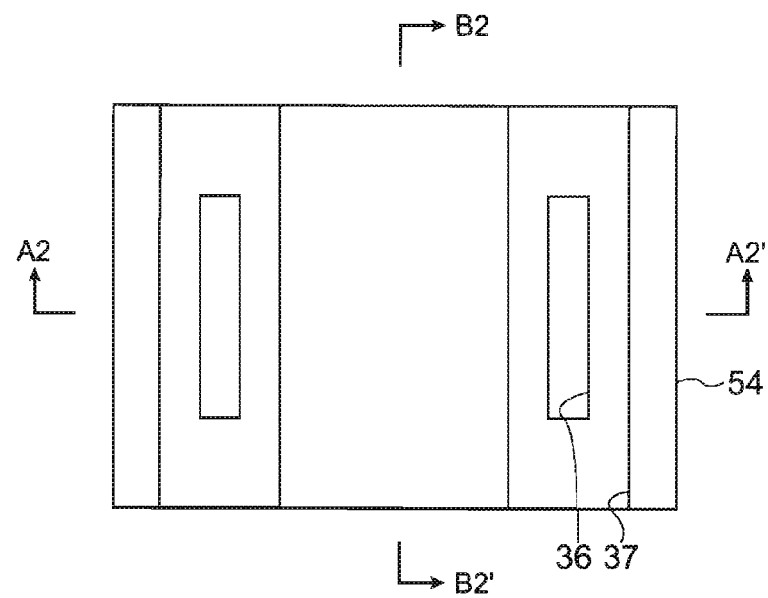
FIGS. 2A to 2C show the method for manufacturing the semiconductor device according to the first embodiment of the invention.
Figure 2B:
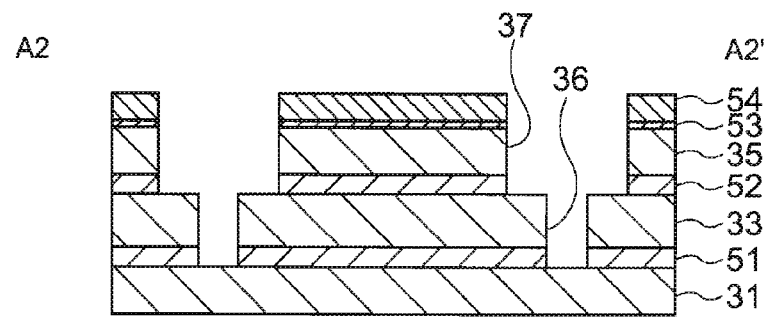
Figure 2C:
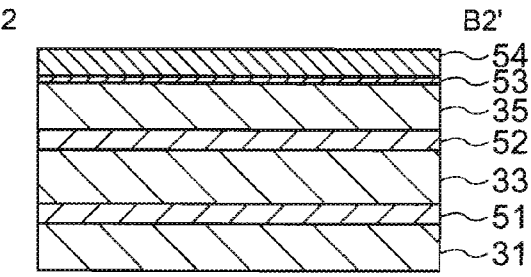

Next, as shown in FIGS. 2A to 2C, the antioxidant film 54, the base oxide film 53 and the semiconductor layers 35, 52, 33 and 51 are patterned by using photolithography and etching techniques. The patterning allows a groove 36 for exposing the semiconductor substrate 31 to be formed in a predetermined direction. Here, when exposing the semiconductor substrate 31, etching may be stopped on a surface of the semiconductor substrate 31, or a recess may be formed in the semiconductor substrate 31 by over-etching the semiconductor substrate 31. Additionally, a position of the groove 36 may be arranged coincidentally with a part of an element separation region on the semiconductor layer 33.

In addition, instead of exposing the surface of the semiconductor layer 33, etching may be stopped on a surface of the semiconductor layer 52. Alternatively, over-etching of the semiconductor layer 52 may be performed but stopped in the middle thereof. Here, stopping the etching of the semiconductor layer 52 can prevent the surface of the semiconductor layer 33 in the groove 36 from being exposed outside. Consequently, when removing the semiconductor layers 51 and 52 by etching, it is possible to reduce a time in which the semiconductor layer 33 in the groove 36 is exposed to an etching gas or liquid, whereby over-etching of the semiconductor layer 33 in the groove 36 can be suppressed.

Figure 3A:
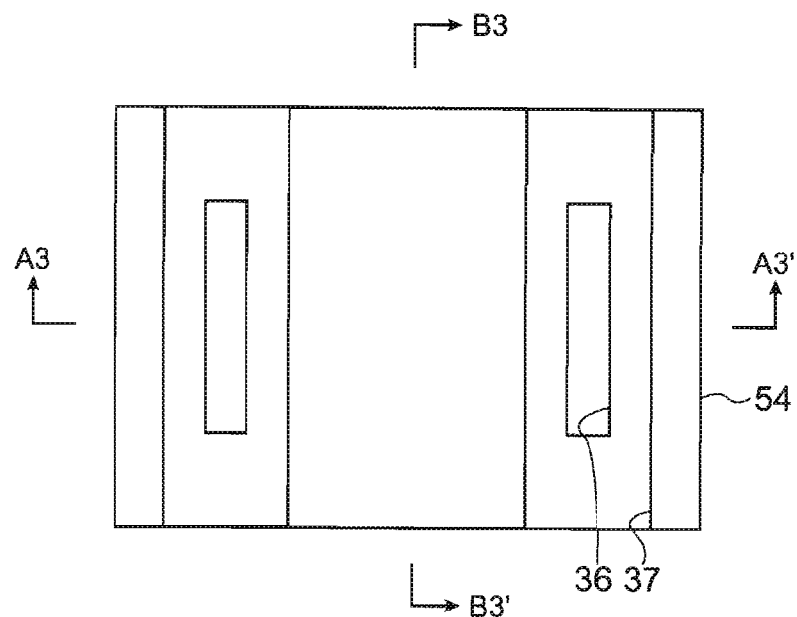
FIGS. 3A to 3C show the method for manufacturing the semiconductor device according to the first embodiment of the invention.
Figure 3B:
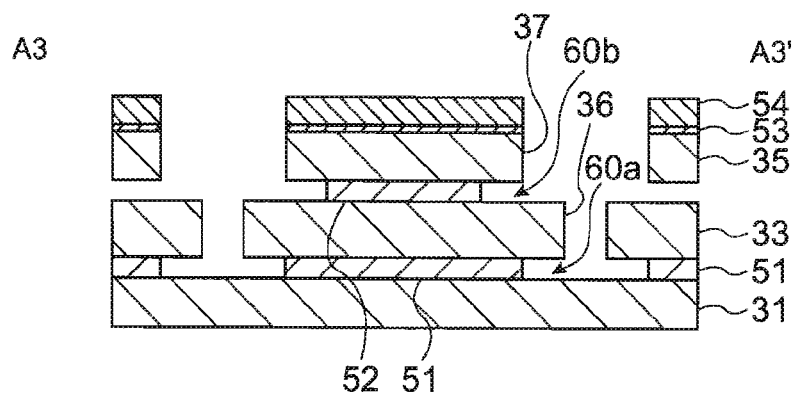
Figure 3C:
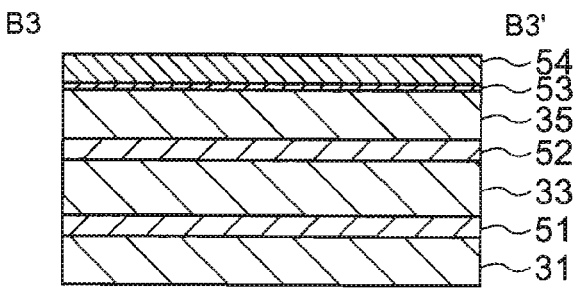

Next, as shown in FIGS. 3A to 3C, the semiconductor layers 51 and 52 are etched in a lateral direction via the grooves 36 and 37 to remove a part of each of the semiconductor layers 51 and 52 respectively arranged under the semiconductor layers 33 and 35. This allows formation of spaces 60a and 60b for exposing top and bottom surfaces of ends of the semiconductor layers 33 and 35, respectively, from the semiconductor layers 51 and 52.

Figure 4A:
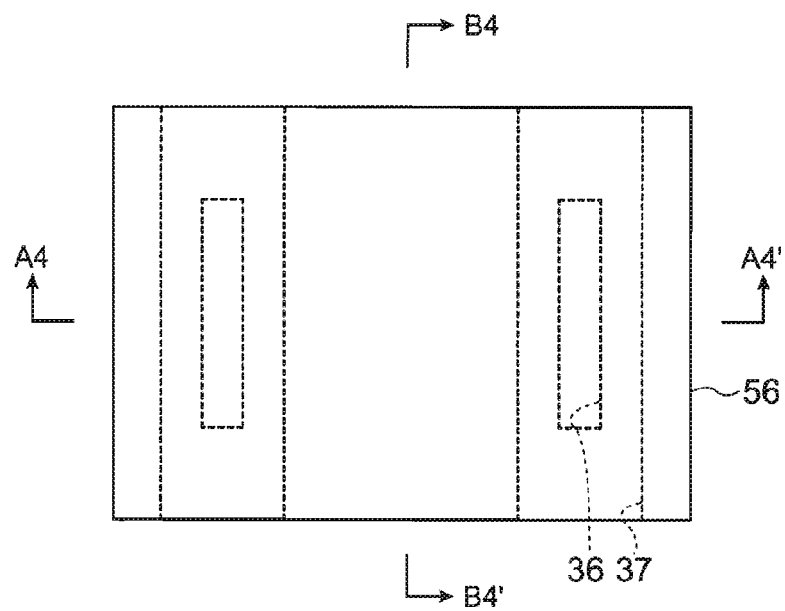
FIGS. 4A to 4C show the method for manufacturing the semiconductor device according to the first embodiment of the invention.
Figure 4B:
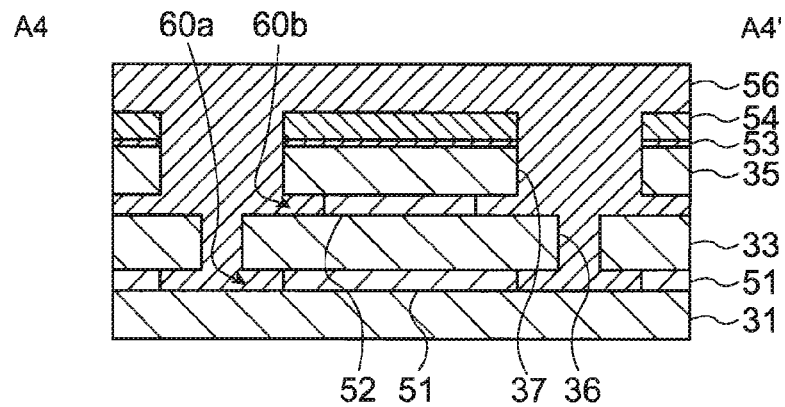
Figure 4C:
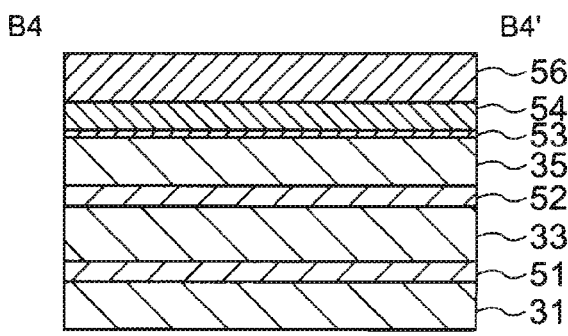

Next, as shown in FIGS. 4A to 4C, using a method such as CVD, a support member 56 is formed on an entire surface of the semiconductor substrate 31. The support member 56 is buried in the grooves 36 and 37 to support the semiconductor layers 33 and 35 on the semiconductor substrate 31. Here, since the spaces 60a and 60b are formed to expose the top and bottom surfaces of the ends of the semiconductor layers 33 and 35 from the semiconductor layers 51 and 52, the support member 56 can be buried in the grooves 36 and 37 and reach under the semiconductor layers 33 and 35 via sidewalls thereof, respectively. For example, the material of the support member 56 may be, other than a silicon oxide film, a fluorosilicate glass (FSG) film or the like. Alternatively, as the material thereof, other than a spin-on-glass (SOG) film, there may be used an organic low-k film such as a phosphosilicate glass (PSG) film, a borophosphosilicate glass (BPSG) film, a poly(arylene ether) (PAE) film, a hydrogen silsesquioxane (HSQ) film, a methyl silsesquioxane (MSQ) film, a PCB film, a CF film, an SiOC film or an SiOF film, or a porous film of any of those.

Figure 5A:
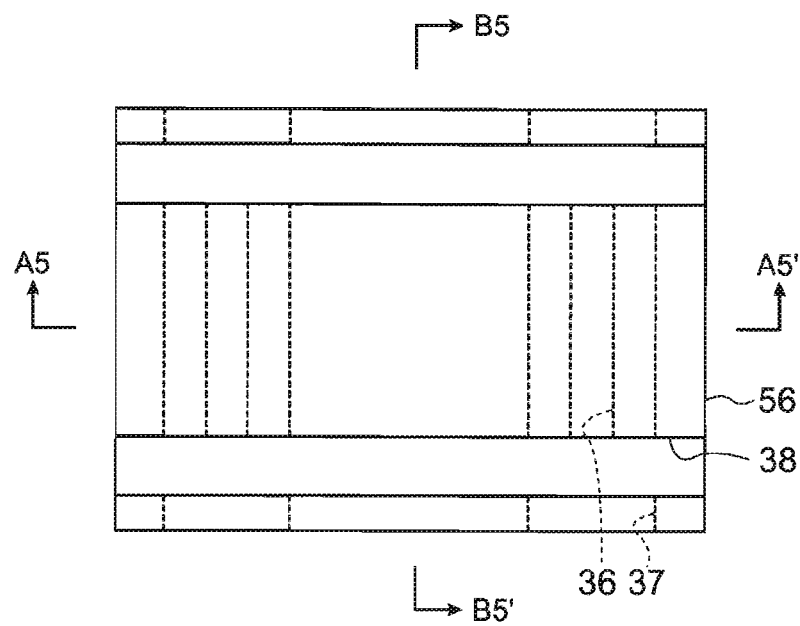
FIGS. 5A to 5C show the method for manufacturing the semiconductor device according to the first embodiment of the invention.
Figure 5B:
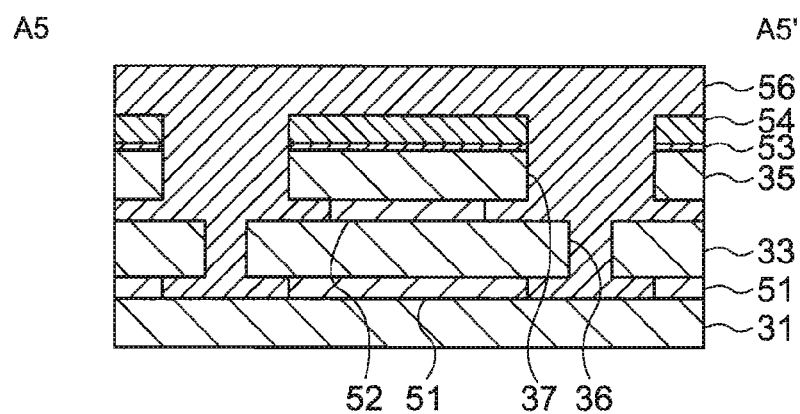
Figure 5C:
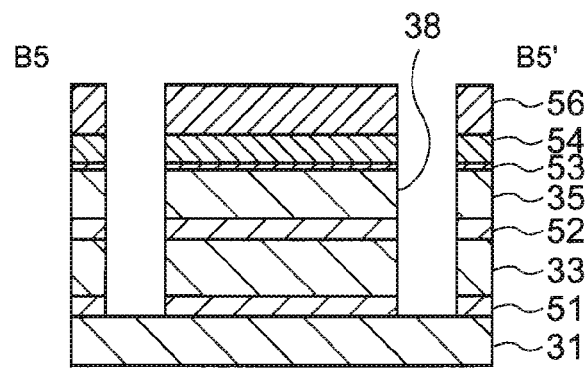

Next, as shown in FIGS. 5A to 5C, the antioxidant film 54, the base oxide film 53, the semiconductor layers 35, 52, 33 and 51 are patterned by using photolithography and etching techniques. This allows formation of a groove 38 for exposing the semiconductor substrate 31 in a direction orthogonal to the groove 36. When exposing the semiconductor substrate 31, etching may be stopped on the surface of the semiconductor substrate 31. Alternatively, a recess may be formed in the semiconductor substrate 31 by over-etching thereof In addition, the position of the groove 38 may be arranged coincidentally with an element separation region on each of the semiconductor layers 33 and 35.

Figure 6A:
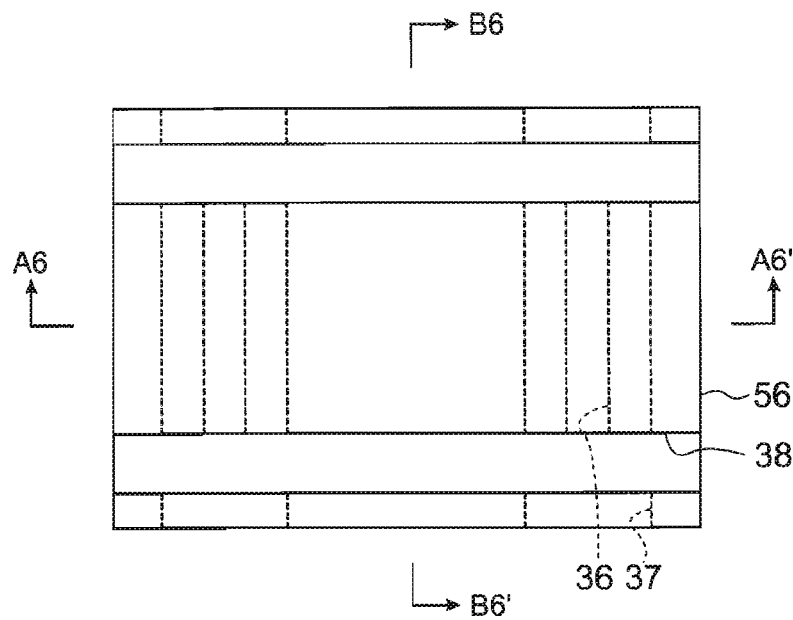
FIGS. 6A to 6C show the method for manufacturing the semiconductor device according to the first embodiment of the invention.
Figure 6B:
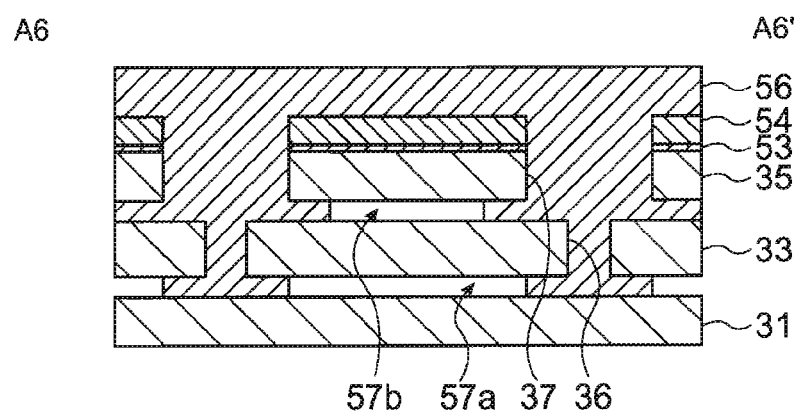
Figure 6C:
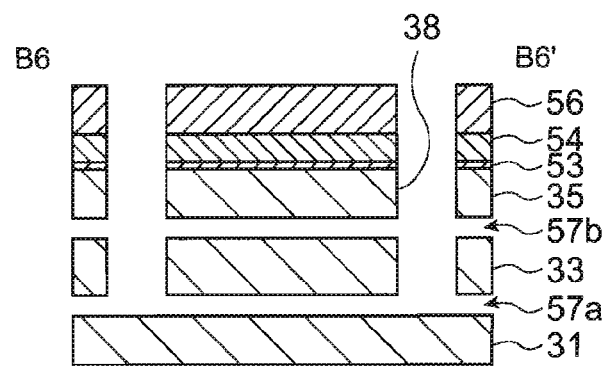

Next, as shown in FIGS. 6A to 6C, contacting the semiconductor layers 51 and 52 with an etching gas or liquid via the groove 38 allows the semiconductor layers 51 and 52 to be removed by etching. Thereby, a space 57a is formed between the semiconductor substrate 31 and the semiconductor layer 33 and also a space 57b is formed between the semiconductor layers 33 and 35.

In this case, even when the arrangement of the support member 56 in the grooves 36 and 37 allows removal of the semiconductor layers 51 and 52, it is possible to support the semiconductor layers 33 and 35 on the semiconductor substrate 31. Additionally, arranging the groove 38 differently from the grooves 36 and 37 allows the semiconductor layers 51 and 52 arranged under the semiconductor layers 33 and 35, respectively, to contact with an etching gas or liquid. Consequently, without damaging crystal quality of the semiconductor layers 33 and 35, it is possible to achieve insulation between the semiconductor layers 33, 35 and the semiconductor substrate 31.

When the semiconductor substrate 31 and the semiconductor layers 33, 35 are made of Si and the semiconductor layers 51, 52 are made of SiGe, it is preferable to use a mixture of HF/HNO$_3$ as an etching liquid for the semiconductor layers 51 and 52. This can provide a selectivity ratio between Si and SiGe of approximately 1:100 to 1000. Thus, while suppressing over-etching of the semiconductor substrate 31 and the semiconductor layers 33 and 35, the semiconductor layers 51 and 52 can be removed. Alternatively, the etching liquid for the semiconductor layers 51 and 52 may be HF—HNO$_3$—H$_2$O$_2$, NH$_3$—H$_2$O$_2$ or HF—CH$_3$COOH—H$_2$O$_2$ or the like.

Furthermore, before removing the semiconductor layers 51 and 52 by etching, anodic oxidation may be performed to make the layers porous. Alternatively, ion-implantation may be performed to make the semiconductor layers 51 and 52 amorphous. Consequently, etching rates of those layers can be increased. Thus, while suppressing over-etching of the semiconductor layers 33 and 35, it is possible to expand an etching area for the semiconductor layers 51 and 52, respectively.

Figure 7A:
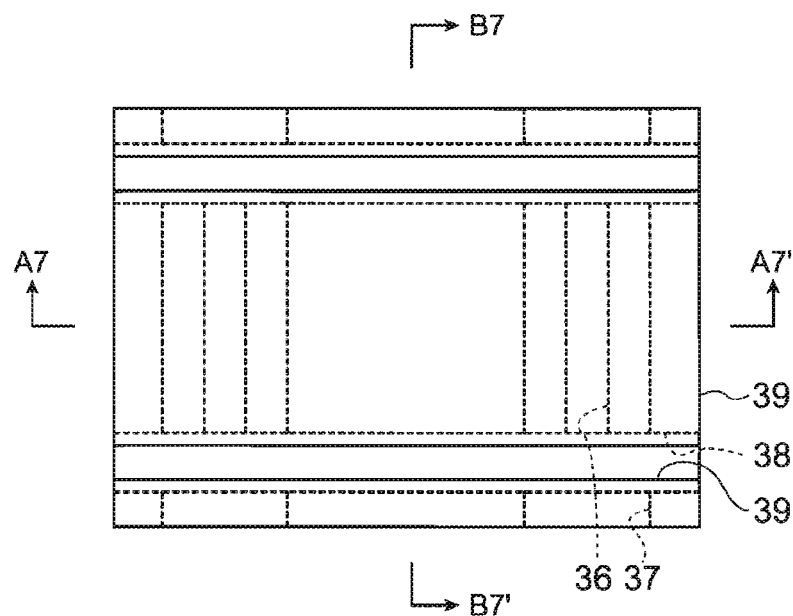
FIGS. 7A to 7C show the method for manufacturing the semiconductor device according to the first embodiment of the invention.
Figure 7B:
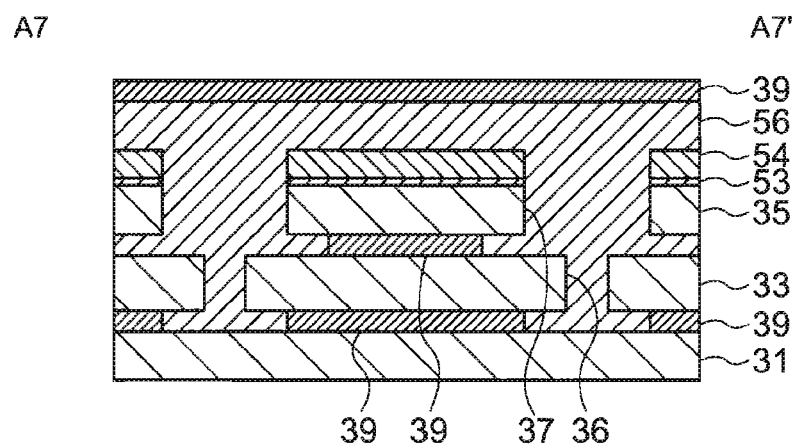
Figure 7C:
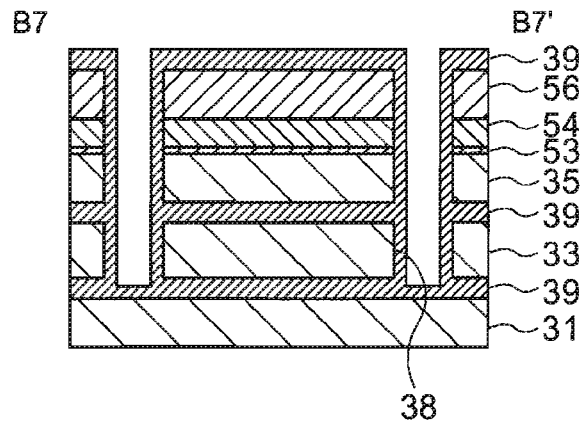

Next, as shown in FIGS. 7A to 7C, a buried insulating layer 39 is formed so as to be buried in the spaces 57a and 57b between the semiconductor substrate 31 and the semiconductor layers 33 and 35 by using a process such as CVD or SOG. As the material of the buried insulating layer 39, it is preferable to use a material having a relative dielectric constant greater than that of the support member 56, such as a silicon oxide film, a silicon nitride film or the like. Other than a silicon oxide film, for example, the buried insulating film 39 may be made of a dielectric material such as HfO$_2$, HfON, HfAlO, HfAlON, HfSiO, HfSiON, ZrO$_2$, ZrON, ZrAlO, ZrAlON, ZrSiO, ZrSiON, Ta$_2$O$_5$, Y$_2$O$_3$, (Sr, Ba)TiO$_3$, LaAlO$_3$, SrBi$_2$Ta$_2$O$_9$, Bi$_4$Ti$_3$O$_{12}$ or Pb(Zi, Ti)O$_3$.

In this manner, the semiconductor layers 33 and 35 can be supported on the semiconductor substrate 31 not only from the sidewalls thereof but from thereunder. Also, the buried insulating layer 39 and the support member 56 having mutually different relative dielectric constants can be arranged under the semiconductor layers 33 and 35. Consequently, while suppressing bending of the semiconductor layers 33 and 35, the buried insulating layer 39 can be formed under each of the semiconductor layers 33 and 35. Additionally, it is possible to improve uniformity of the film thicknesses of the semiconductor layers 33, 35 and the buried insulating layer 39. Furthermore, even when forming the field-effect transistor on the semiconductor layer 35, a backgate electrode comprised of the semiconductor layer 33 can be arranged under the semiconductor layer 35. Also, the backgate electrode can be coupled to a channel region via a high dielectric material and can also be coupled to the source and drain layers via a low dielectric material. As a result, the backgate electrode can be arranged without restriction by the arrangements of the backgate electrode, source and drain contacts, etc, and threshold controllability by the backgate electrode can be enhanced, with a reduction in source and drain parasitic capacitance. Still furthermore, transistor operating and standby power consumption can be reduced and the SOI transistor can exhibit high-speed performance.

Figure 8A:
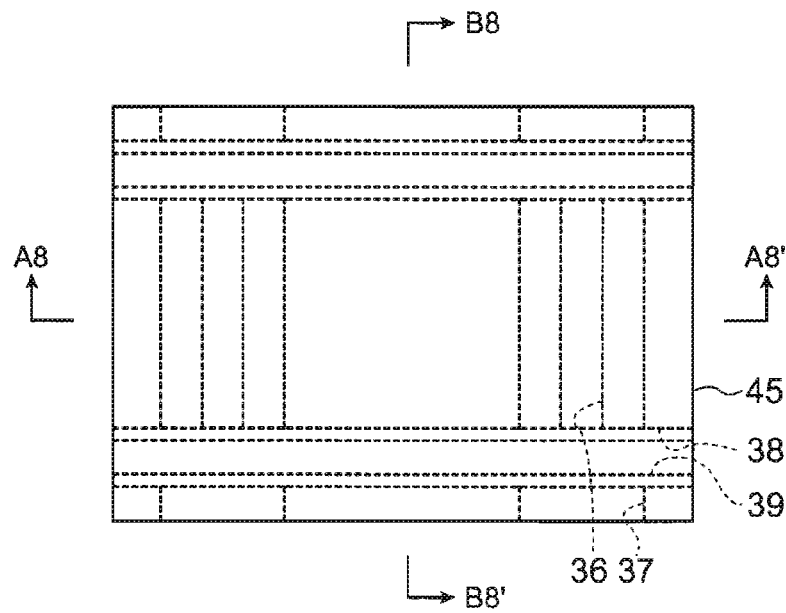
FIGS. 8A to 8C show the method for manufacturing the semiconductor device according to the first embodiment of the invention.
Figure 8B:
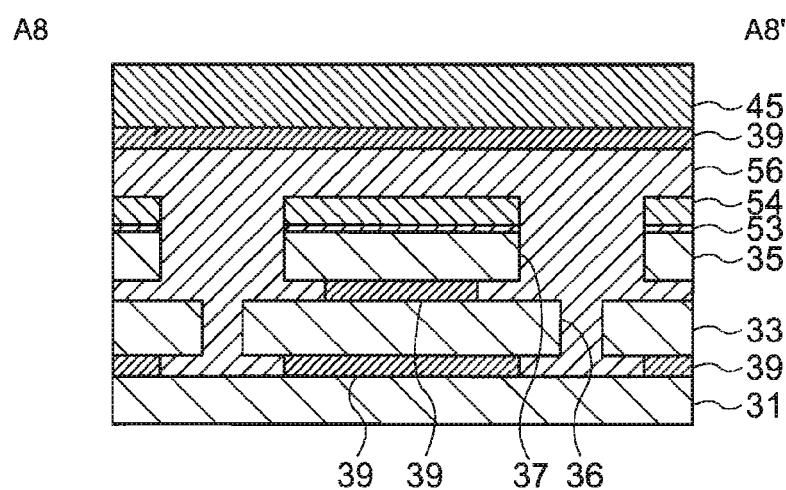
Figure 8C:
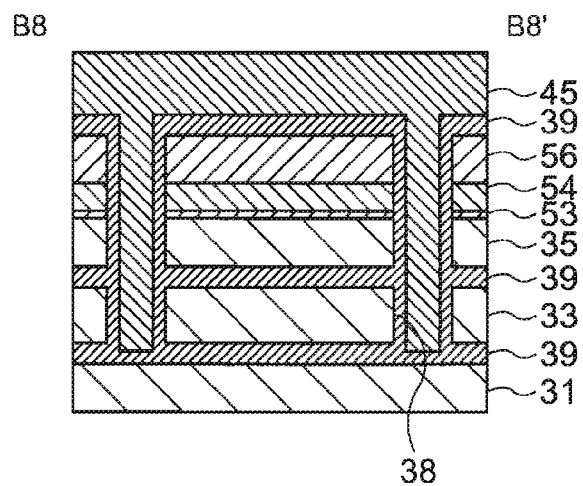

Next, as shown in FIGS. 8A to 8C, an insulating layer 45 is deposited on the support member 56 so as to bury the inside of the groove 38 by using a method such as CVD, spin-on-glass (SOG) or the like. For example, the insulating layer 45 may be made Of SiO$_2$, Si$_3$N$_4$ or the like.

Figure 9A:
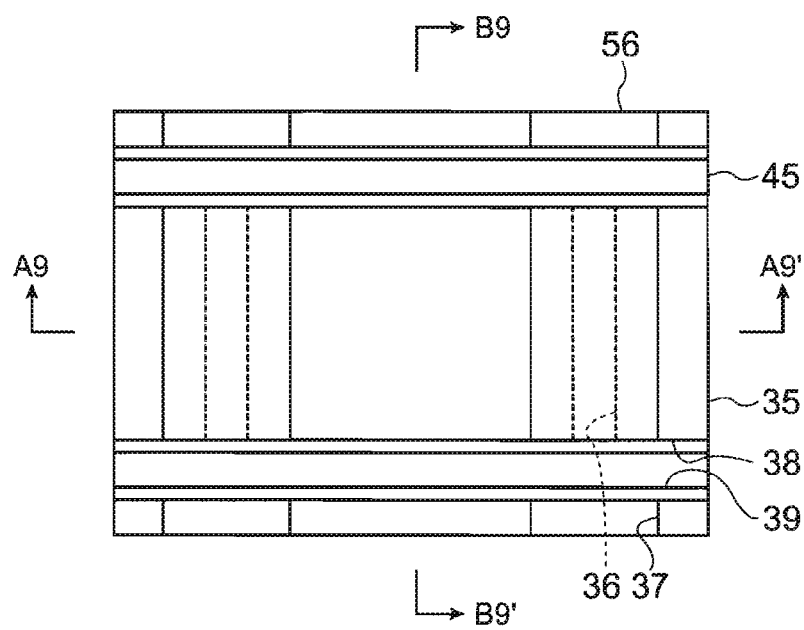
FIGS. 9A to 9C show the method for manufacturing the semiconductor device according to the first embodiment of the invention.
Figure 9B:
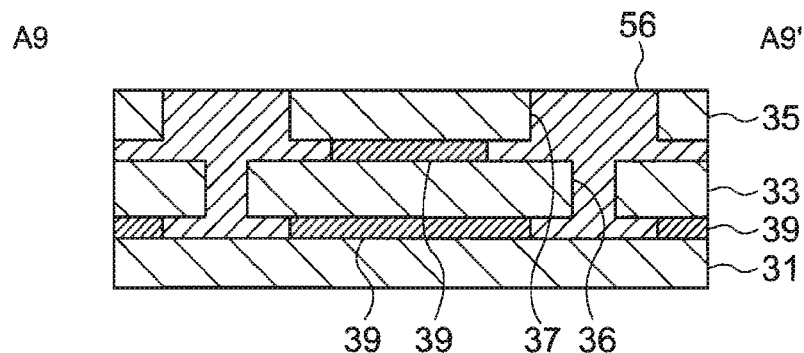
Figure 9C:
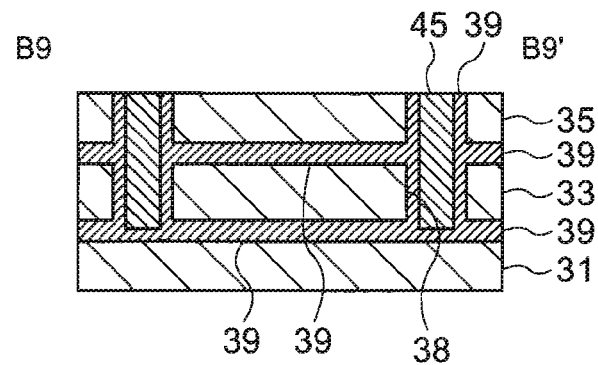

Next, as shown in FIGS. 9A to 9C, thin-film formation of the insulating layer 45 and the support member 56 are performed by chemical mechanical planarization (CMP) or the like, and the antioxidant film 54 and the base oxide film 53 are removed to expose a surface of the semiconductor layer 35.

In FIGS. 8A to 8C or FIGS. 9A to 9C, with the selection of an appropriate acceleration energy, a dopant can be introduced into only the semiconductor layer 33 by ion-implantation. Then, crystalline recovery and dopant activation can be achieved using an annealing process.

Figure 10A:
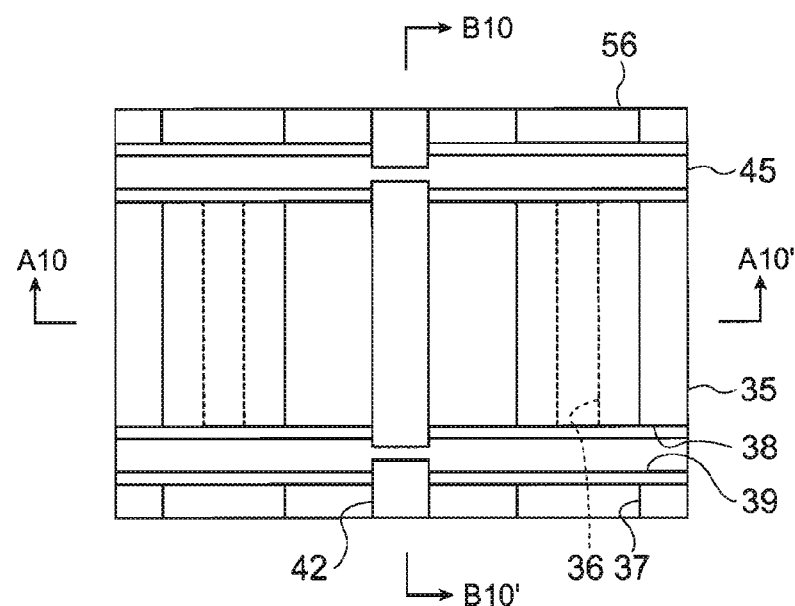
FIGS. 10A to 10C show the method for manufacturing the semiconductor device according to the first embodiment of the invention.
Figure 10B:
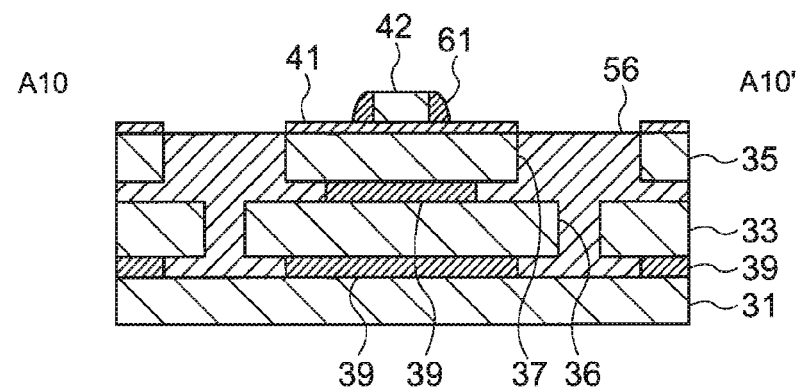
Figure 10C:
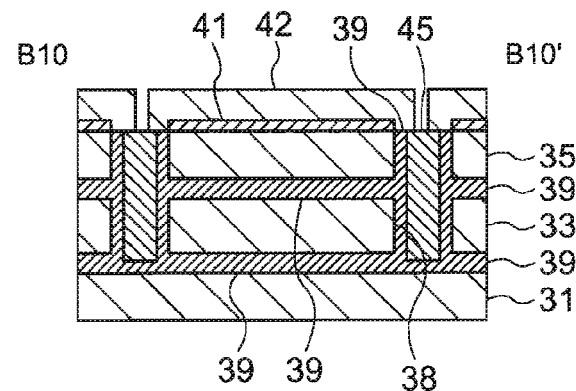

Next, as shown in FIGS. 10A to 10C, thermal oxidation of the surface of the semiconductor layer 35 allows a gate insulating film 41 to be formed thereon. Then, a polycrystalline silicon layer is formed on the semiconductor layer 35 having the gate insulating film 41 by using CVD or the like. Thereafter, the polycrystalline silicon layer is patterned by photolithography and etching to form a gate electrode 42, which is to be arranged on the semiconductor layer 35.

Figure 11A:
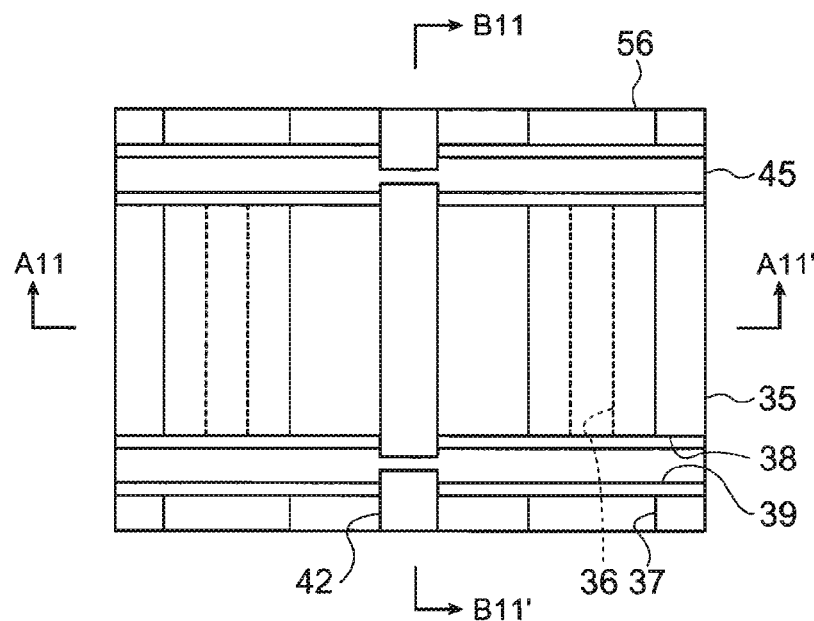
FIGS. 11A to 11C show the method for manufacturing the semiconductor device according to the first embodiment of the invention.
Figure 11B:
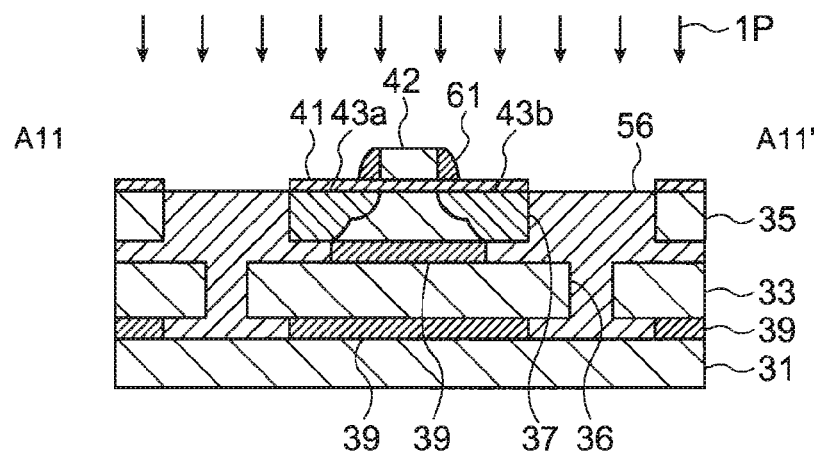
Figure 11C:
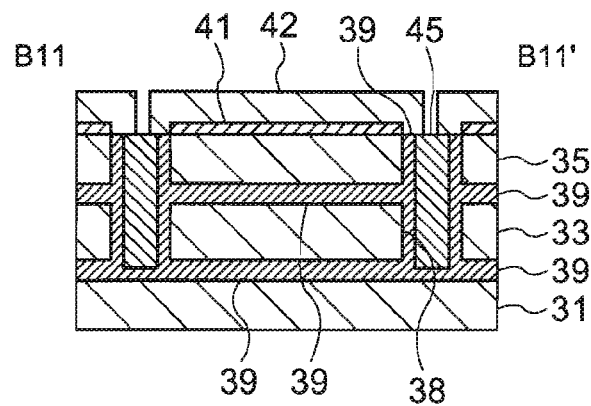

Next, as shown in FIGS. 11A to 11C, using the gate electrode 42 as a mask, an ion of an impurity element, such as B, BF$_2$, As or P, is implanted into the semiconductor layer 35 to form source and drain layers 43a and 43b so as to sandwich the gate electrode 42 therebetween.

Figure 12A:
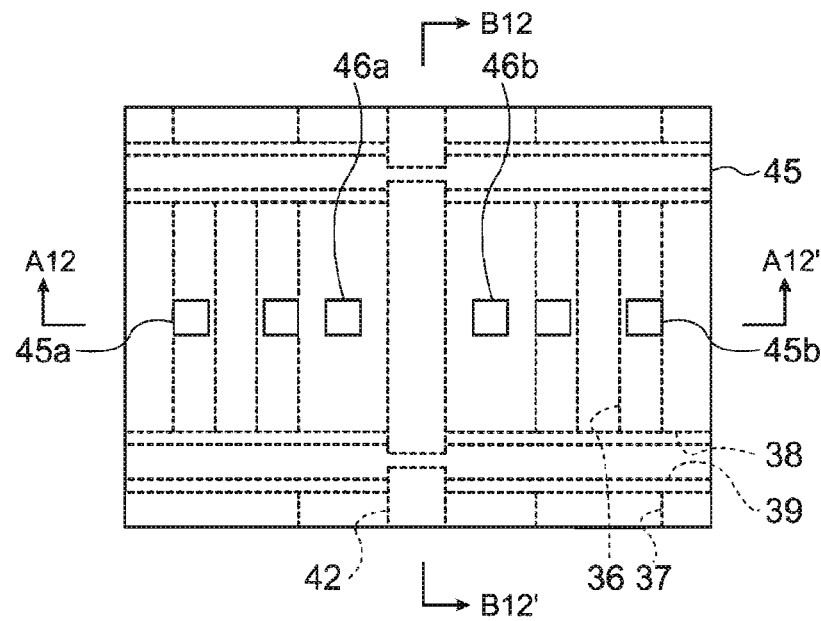
FIGS. 12A to 12C show the method for manufacturing the semiconductor device according to the first embodiment of the invention.
Figure 12B:
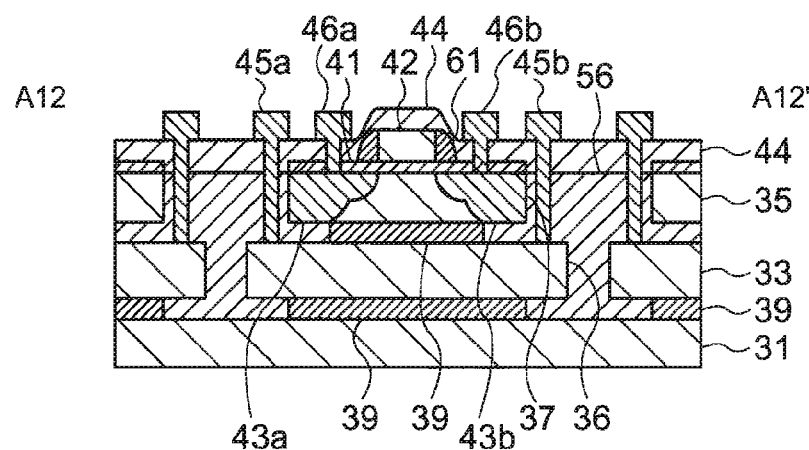
Figure 12C:
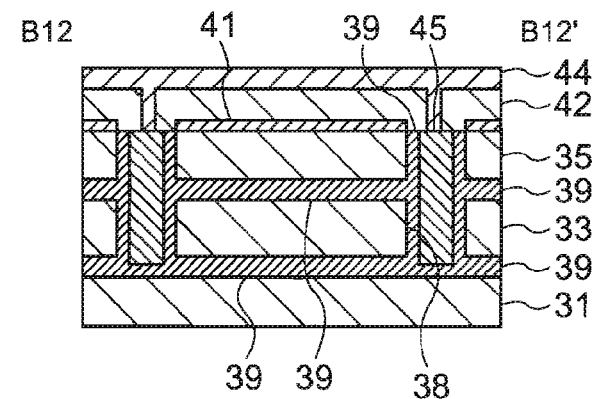

Next, as shown in FIGS. 12A to 12C, an interlayer insulating layer 44 is deposited on the gate electrode 45 by using a method such as CVD. Then, backgate contact electrodes 45a and 45b are formed on the interlayer insulating layer 44, where the backgate contact electrodes 45a and 45b are buried in the interlayer insulating layer 44 and the support member 56 to be connected to the semiconductor layer 33. Additionally, a source contact electrode 46a and a drain contact electrode 46b are formed on the interlayer insulating layer 44. The source and drain contact electrodes 46a and 46b are buried in the interlayer insulating layer 44 and connected to the source and drain layers 47a and 47b, respectively.

Alternatively, the gate electrode 45 may be electrically connected to the semiconductor layer 33 via the backgate contact electrodes 45a and 45b. This makes it possible to control such that the backgate electrode can have a potential equal to that of the gate electrode 45. Thereby, it is possible to enhance controllability to the potential of a deep part in the channel region. Consequently, while suppressing an increase in chip size, the off-time leakage current and operating and standby power consumption can be reduced. Furthermore, the field-effect transistor can have a high breakdown voltage.

Second Embodiment

FIGS. 13A, 14A, 15A, 16A, 17A, 18A, 19A, 20A, 21A, 22A, 23A, 24A, 25A and 26A are plan views showing a method for manufacturing a semiconductor device according to a second embodiment of the invention. FIGS. 13B, 14B, 15B, 16B, 17B, 18B, 19B, 20B, 21B, 22B, 23B, 24B, 25B and 26B are sectional views taken along lines A13-A13', A14-A14', A15-A15', A16-A16', A17-A17', A18-A18', A19-A19', A20-A20', A21-A21', A22-A22', A23-A23', A24-A24', A25-A25' and A26-A26', respectively, as shown in the above-mentioned figures. FIGS. 13C, 14C, 15C, 16C, 17C, 18C, 19C, 20C, 21C, 22C, 23C, 24C, 25C and 26C are sectional views taken along lines B13-B13', B14-B14', B15-B15', B16-B16', B17-B17', B18-B18', B19-B19', B20-B20', B21-B21', B22-B22', B23-B23', B24-B24', B25-B25' and B26-B26' respectively, as shown in the above figures.

Figure 13A:
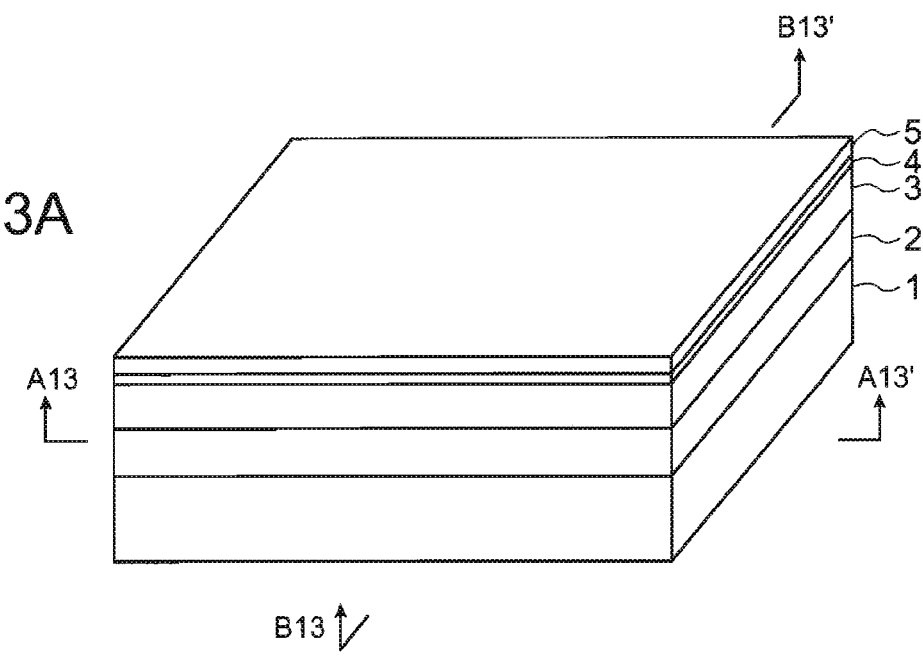
FIGS. 13A to 13C show a method for manufacturing a semiconductor device according to a second embodiment of the invention.
Figure 13B:
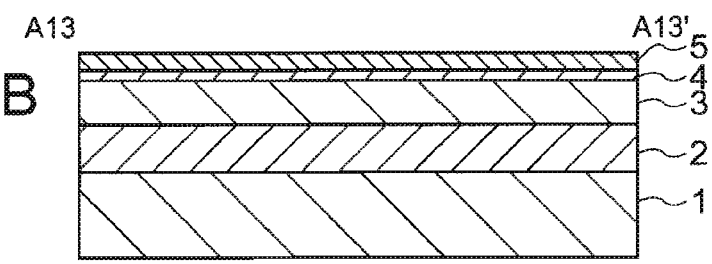
Figure 13C:
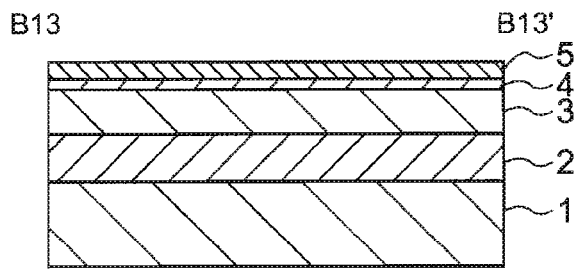

In FIGS. 13A to 13C, a first semiconductor layer 2 is formed on a semiconductor substrate 1 by epitaxial growth, and a second semiconductor layer 3 is formed on the first semiconductor layer 2 by epitaxial growth. The first semiconductor layer 2 may be made of material having an etching rate greater than those of the semiconductor substrate 1 and the second semiconductor layer 3. As the material of the semiconductor substrate 1 and the first and second semiconductor layers 3, for example, there may be used a combination selected from materials such as Si, Ge, SiGe, SiC, SiSn, PbS, GaAs, InP, GaP, GaN, ZnSe or the like. In particular, when the semiconductor substrate 1 is made of Si, it is preferable to use SiGe for the first semiconductor layer 2 and Si for the second semiconductor layer 3. In this manner, while obtaining a lattice match between the first semiconductor layer 2 and the second semiconductor layer 3, a selectivity ratio therebetween can be ensured. Additionally, as the first semiconductor layer 2, other than a single-crystal semiconductor layer, it may be possible to use a semiconductor layer of polycrystalline, amorphous or porous material. In addition, as an alternative to the first semiconductor layer 2, it may be possible to use a metal oxide film such as a gamma-aluminum oxide film, which allows film-formation of a single-crystal semiconductor layer by epitaxial growth. Furthermore, the first and second semiconductor layers 2 and 3 can each have a film thickness ranging approximately from 1 to 200 nm, for example.

Then, thermal oxidation or CVD is performed on the second semiconductor layer 3 to form a base oxide film 4 thereon to protect the surface thereof. Next, an antioxidant film 5 is formed on an entire surface of the base oxide film 4 by using a method such as CVD. For example, a silicon nitride film may be used as the antioxidant film 5, which can serve not only as an oxidation inhibiting film but as a stopper layer for planarization processes by CMP.

Figure 14A:
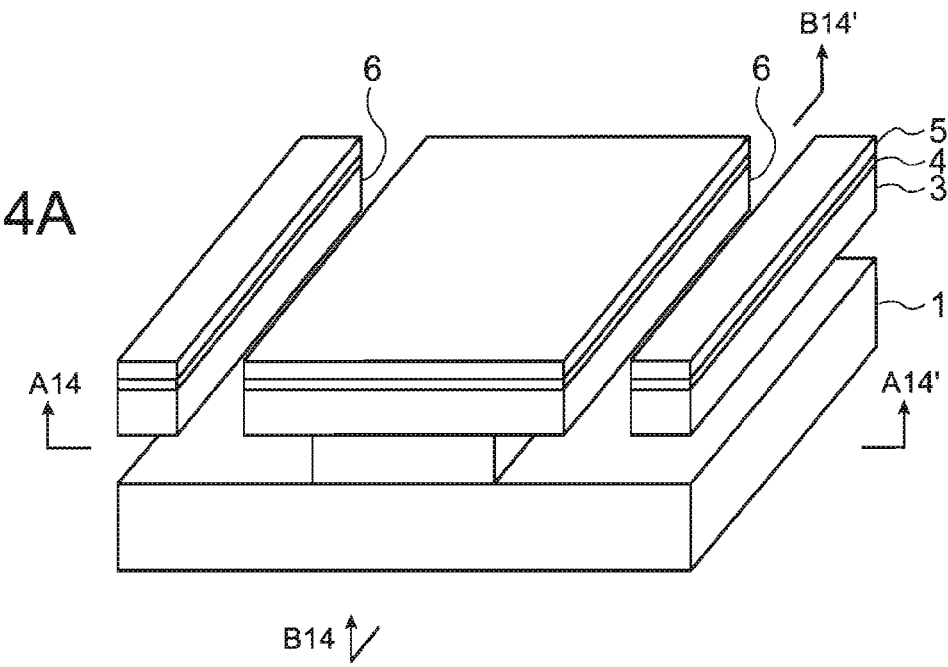
FIGS. 14A to 14C show the method for manufacturing the semiconductor device according to the second embodiment of the invention.
Figure 14B:
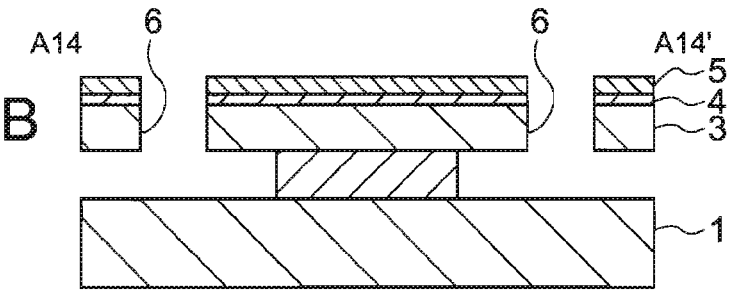
Figure 14C:
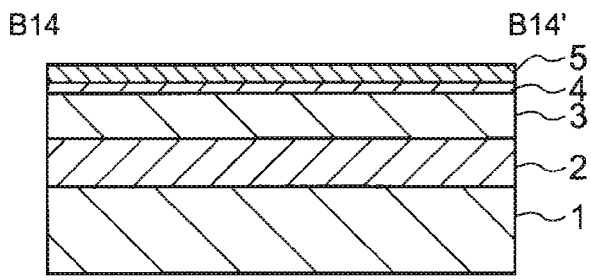
Figure 25A:
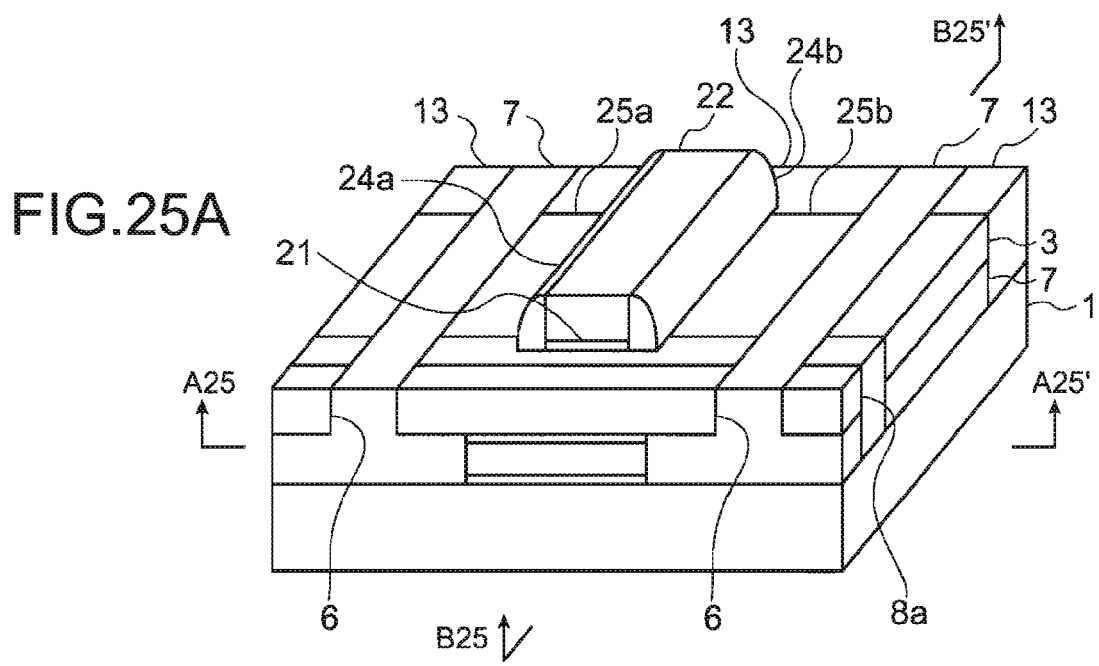
FIGS. 25A to 25C show the method for manufacturing the semiconductor device according to the second embodiment of the invention.
Figure 25B:
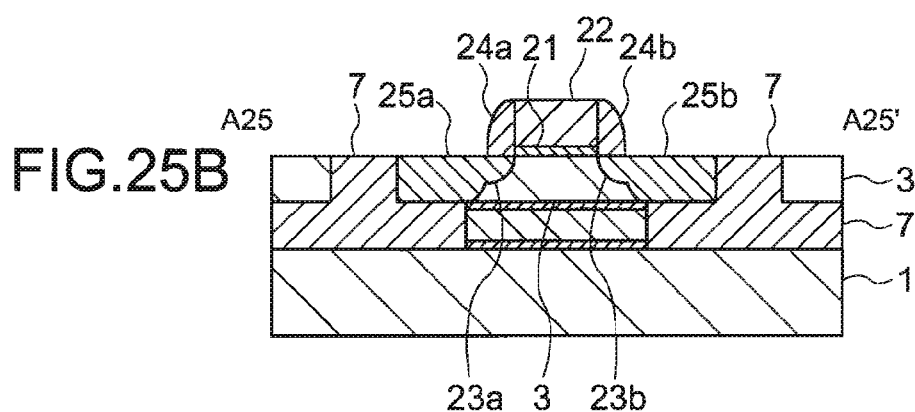
Figure 25C:
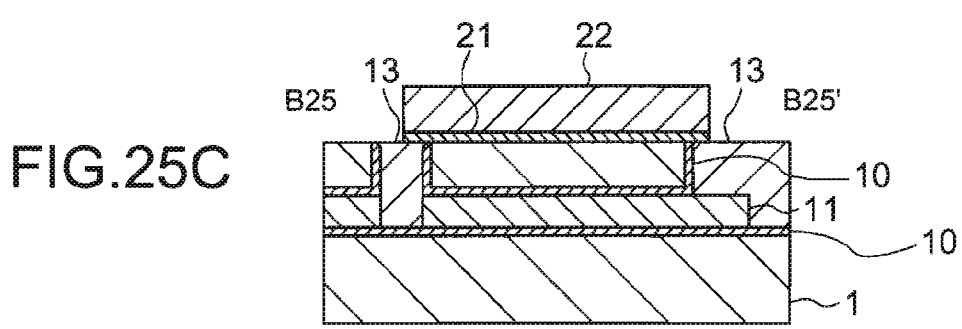

Next, as shown in FIGS. 14A to 14C, the antioxidant film 5, the base oxide film 4, the second semiconductor layer 3 and the first semiconductor layer 2 are patterned by using photolithography and etching techniques to form a groove 6 for exposing a part of the semiconductor substrate 1. When exposing a part of the semiconductor substrate 1, etching may be stopped on a surface thereof. Alternatively, a recess may be formed in the semiconductor substrate 1 by over-etching thereof. The position of the groove 6 can be arranged coincidentally with a part of an element separation region on the second semiconductor layer 3. Then, a part of the first semiconductor layer 2 arranged under the second semiconductor layer 3 is removed by lateral etching thereof via the groove 6 to expose bottom surfaces of ends of the second semiconductor layer 3 from the first semiconductor layer 2. When laterally etching the first semiconductor layer 2, it is preferable to coincide the part where the first semiconductor layer has been removed with a source layer 25a and a drain layer 25b, as shown in FIGS. 25A and 25B, and it is also preferable to coincide a part where the first semiconductor layer 2 has been left with a channel region, as shown in FIGS. 25A to 25C.

Figure 15A:
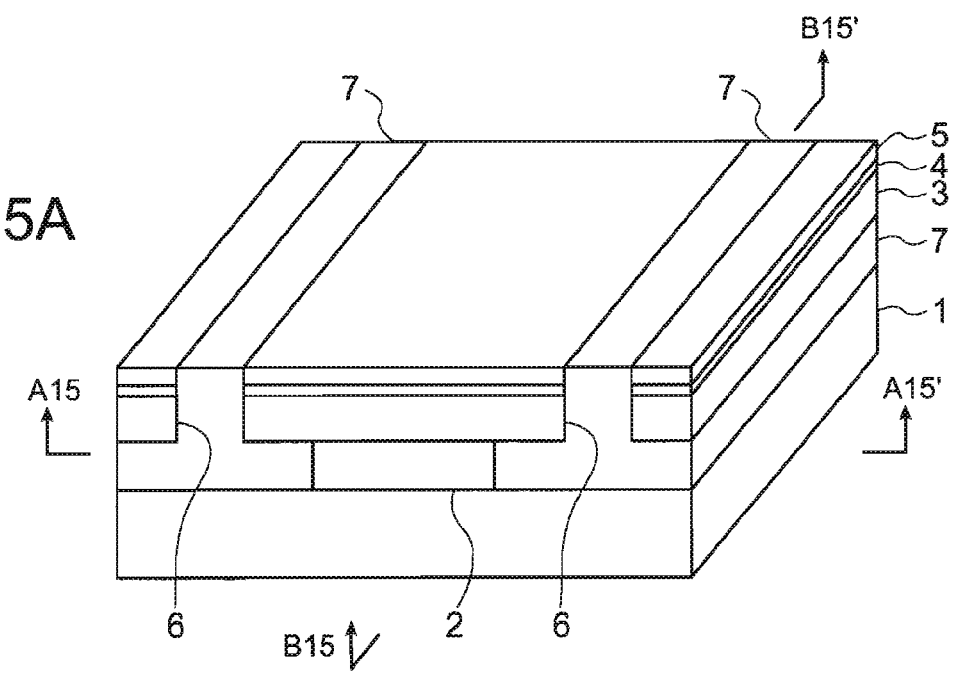
FIGS. 15A to 15C show the method for manufacturing the semiconductor device according to the second embodiment of the invention.
Figure 15B:
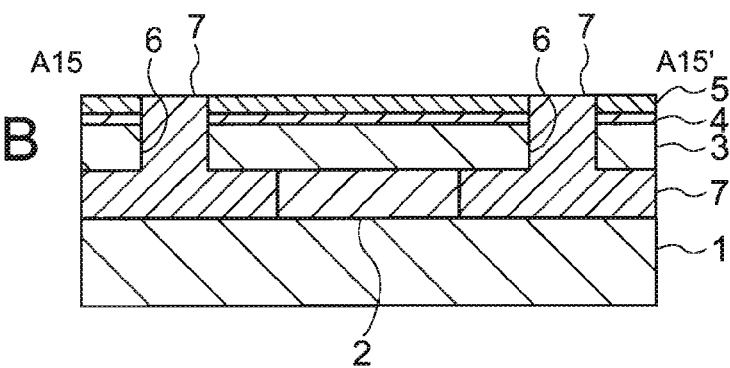
Figure 15C:
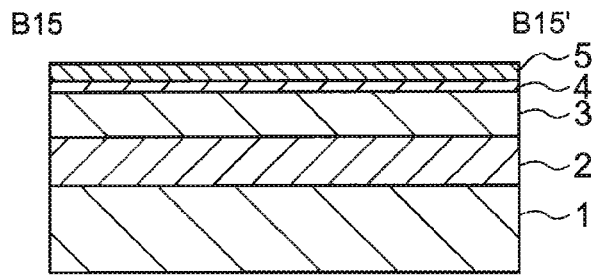

Next, as shown in FIGS. 15A to 15C, using a method such as CVD, a support member 7 is formed on an entire surface of the semiconductor substrate 1. The support member 7 is buried in the groove 6 to reach under the second semiconductor layer 3 via sidewalls thereof so as to support the first semiconductor layer 3 on the semiconductor substrate 1. The support member 7 may be an insulator such as a silicon oxide film, a silicon nitride film or the like. Furthermore, the support member 7 formed so as to cover the entire semiconductor substrate 1 needs to support the second semiconductor layer 3, while suppressing bending of the second semiconductor layer 3 or the like to maintain flatness thereof. Thus, in order to ensure its mechanical strength, it is preferable for the support member 7 to have a film thickness equal to or greater than a minimum size for element separation. For example, in a semiconductor integrated circuit of the 65-nm generation, a preferable film thickness thereof ranges approximately from 100 to 200 nm. In addition, as the material of the support member 7, there may be used an insulator such as a silicon oxide film. Thin-film formation of the support member 7 by using CMP, an etch-back process or the like allows a surface of the antioxidant film 5 to be exposed in a state in which the support member 7 has been buried in the groove 6. Here, arranging the antioxidant film 5 allows the film to serve as a stopper layer in the CMP planarization process.

Figure 16A:
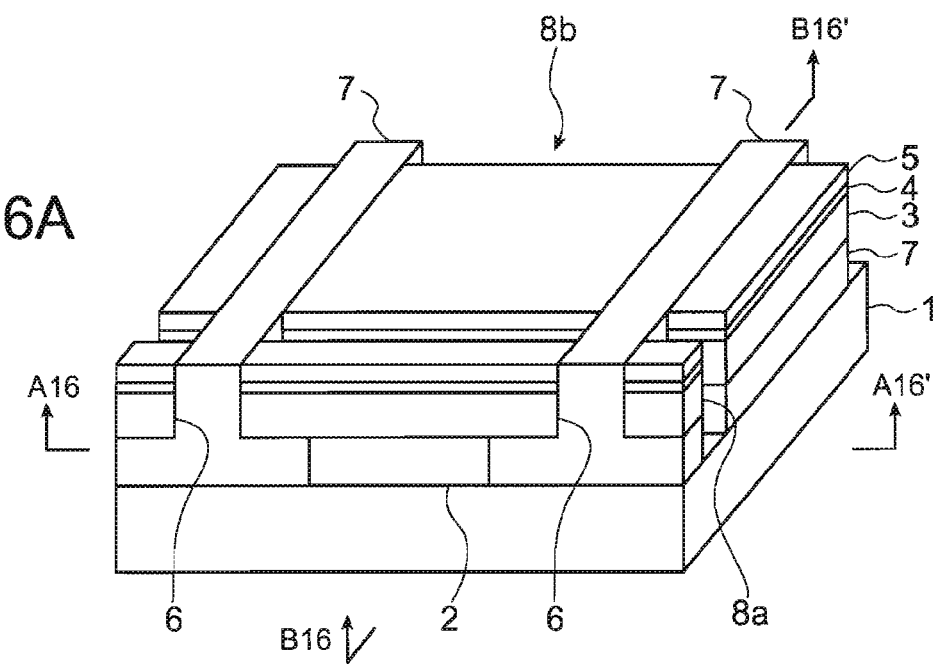
FIGS. 16A to 16C show the method for manufacturing the semiconductor device according to the second embodiment of the invention.
Figure 16B:
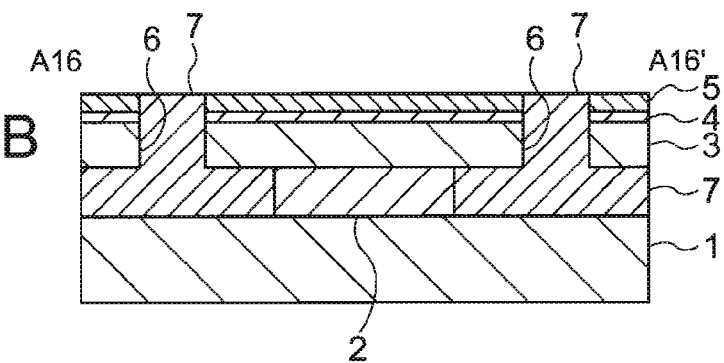
Figure 16C:
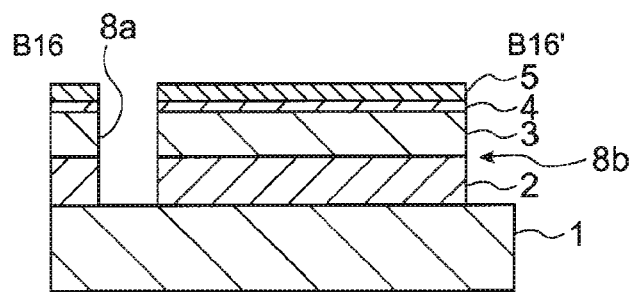

Next, as shown in FIGS. 16A to 16C, the antioxidant film 5, the base oxide film 4, the second semiconductor layer 3 and the first semiconductor layer 2 are patterned by using photolithography and etching techniques to form a groove 8a and a step portion 8b for exposing a part of the first semiconductor layer 2. Here, the positions of the groove 8a and the step portion 8b can be arranged coincidently with a part of the element separation region of the second semiconductor layer 3.

When exposing a part of the first semiconductor layer 2, etching may be stopped on a surface thereof, or a recess may be formed therein by over-etching thereof. Still alternatively, the surface of the semiconductor substrate 1 may be exposed by penetrating through the first semiconductor layer 2 in the groove 8a and on the step portion 8b. Here, stopping the etching of the first semiconductor layer 2 in the middle can prevent the surface of the semiconductor substrate 1 in the groove 8a and on the step portion 8b from being exposed outside. Accordingly, when removing the first semiconductor layer 2 by etching, it is possible to reduce the time in which the semiconductor substrate 1 in the groove 8a and on the step portion 8b is exposed to an etching gas or liquid, which can suppress over-etching thereof.

Figure 17A:
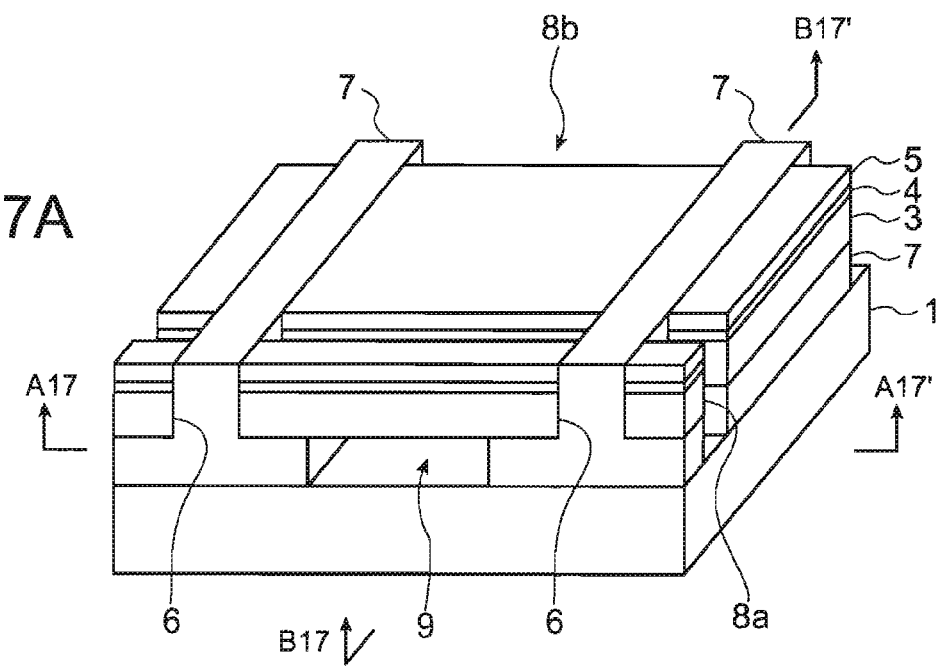
FIGS. 17A to 17C show the method for manufacturing the semiconductor device according to the second embodiment of the invention.
Figure 17B:
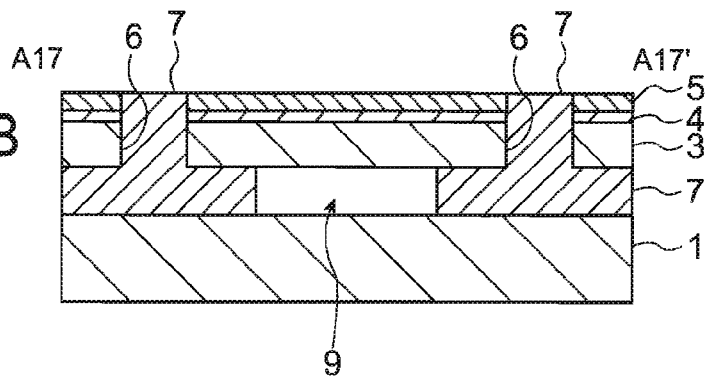
Figure 17C:
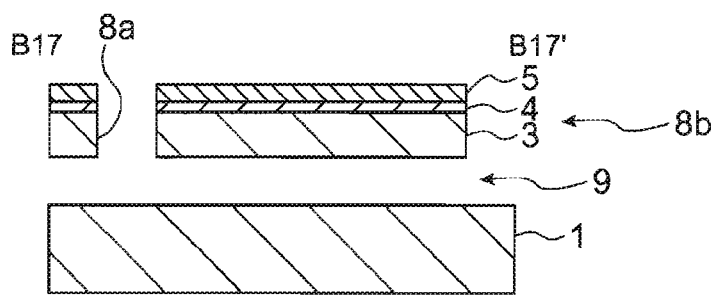

Next, as shown in FIGS. 17A to 17C, the first semiconductor layer 2 is contacted with an etching gas or liquid via the groove 8a and the step portion 8b so as to be removed by etching. Thereby, a cavity 9 is formed between the semiconductor substrate 1 and the second semiconductor layer 3.

Here, even when the first semiconductor layer 2 is removed, arrangement of the support member 7 in the groove 6 allows the second semiconductor layer 3 to be supported on the semiconductor substrate 1. Furthermore, arrangement of the groove 8a other than the groove 6 allows an etching gas or liquid to contact with the first semiconductor layer 2 under the second semiconductor layer 3. Consequently, without damaging quality of the second semiconductor layer 3, it is possible to achieve insulation between the second semiconductor layer 3 and the semiconductor substrate 1.

When the semiconductor substrate 1 and the second semiconductor layer 3 are made of Si and the first semiconductor layer 2 is made of SiGe, it is preferable to use an HF—HNO$_3$—H$_2$O solution (a mixture of hydrofluoric acid, nitric acid and water). Thereby, the first semiconductor layer 2 can be removed, while suppressing over-etching of the semiconductor substrate 1 and the second semiconductor layer 3. Alternatively, a solution of HF/HNO$_3$/H$_2$O$_2$, NH$_4$OH/H$_2$O$_2$O, HF/H$_2$O$_2$/CH$_3$COOH or the like may be used as an etching liquid for the first semiconductor layer 2.

In addition, before removing the first semiconductor layer 2 by etching, anodic oxidation or the like may be performed to make the first semiconductor layer 2 porous, or ion-implantation may be performed to make the layer amorphous. Alternatively, a P-type semiconductor substrate may be used as the semiconductor substrate 1. Consequently, the etching rate of the first semiconductor layer 2 can be increased, whereby an etching area thereof can be expanded.

Figure 18A:
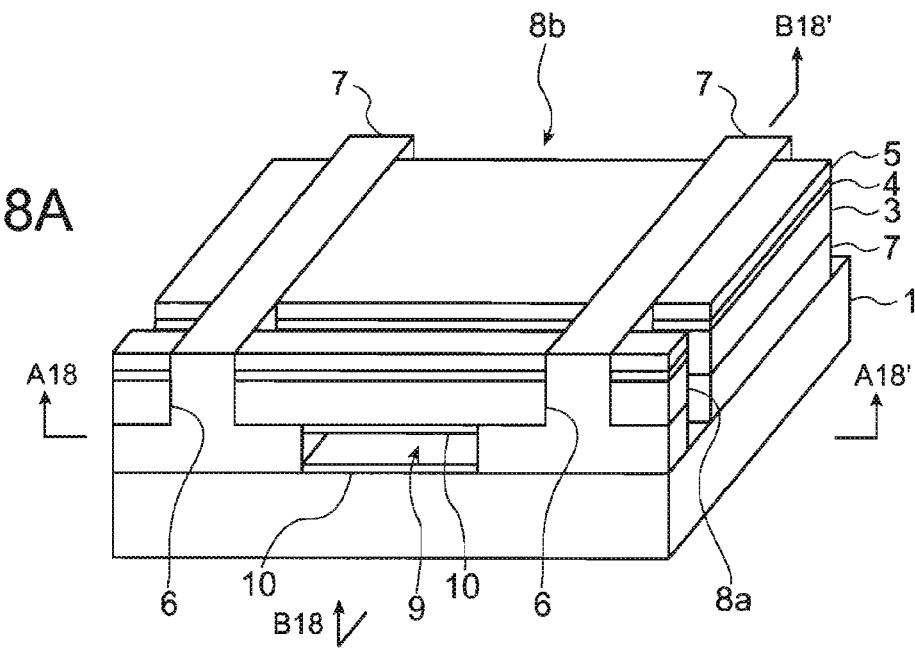
FIGS. 18A to 18C show the method for manufacturing the semiconductor device according to the second embodiment of the invention.
Figure 18B:
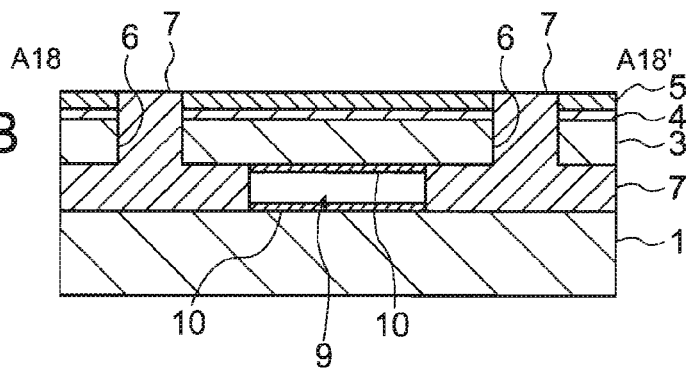
Figure 18C:
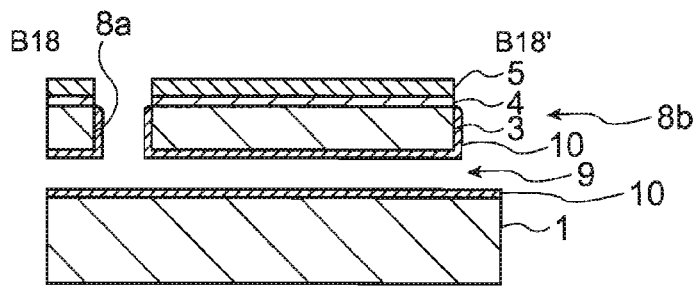

Next, as shown in FIGS. 18A to 18C, thermal oxidation of the semiconductor substrate 1 and the second semiconductor layer 3 allows an insulating film 10 to be formed on top and bottom surfaces of the inside of the cavity 9 between the semiconductor substrate 1 and the second semiconductor layer 3. In this manner, the insulating film 10 can be formed into a thin film while precisely controlling a film thickness thereof formed under the second semiconductor layer 3. Accordingly, a channel potential of the SOI transistor can be efficiently controlled from the back-surface side of the transistor via the insulating film 10. Thus, since a threshold voltage of the SOI transistor can be controlled at a low level, low power consumption can be achieved by using the SOI transistor.

Here, in the method described above by referring to FIGS. 18A to 18C, the insulation film 10 is formed on the top and bottom surfaces inside the cavity 9 between the semiconductor substrate 1 and the second semiconductor layer 3 by thermal oxidation of the substrate 1 and the layer 3. However, film-formation of the insulating film 10 on the top and bottom surfaces inside the cavity may be performed by using atomic-layer-based deposition (ALD), metal-organic-based chemical-vapor deposition (MOCVD) or CVD. In this manner, while preventing film reduction in the second semiconductor layer 3, film-formation of a material other than an oxide film can be made on the top and bottom surfaces thereof. This can increase a relative dielectric constant of the insulating film 10, thereby improving controllability to channel potential in the SOI transistor As the material of the insulating film 10, other than a silicon oxide film, there may be used a silicon nitride film or the like, for example. Alternative examples of the material may include dielectric materials such as HfO$_2$, HfON, HfAlO, HfAlON, HfSiO, HfSiON, ZrO2, ZrON, ZrAlO, ZRAlON, ZrSiO, ZrSiON, Ta$_2$O$_5$, Y$_2$O$_3$, (Sr, Ba)TiO$_3$, LaAlO$_3$, SrBi$_2$Ta$_2$O$_9$, Bi$_4$Ti$_3$O$_{12}$, Pb(Zi, Ti)O$_3$ and the like.

In addition, arrangement of the antioxidant film 5 on the second semiconductor layer 3 allows the insulating film 10 to be formed on the back-surface side of the second semiconductor layer 3, while preventing thermal oxidation of a top surface thereof. This can suppress a film-thickness reduction in the second semiconductor layer 3.

Furthermore, since the positions of the groove 6 and 8a are arranged coincidentally with the element separation region of the second semiconductor layer 3, element separation can be laterally and vertically performed on the second semiconductor layer 3. Additionally, since the support member 7 is buried in the groove 6, it is unnecessary to retain a groove for the support member 7 supporting the second semiconductor layer 3 on the semiconductor substrate 1 in an active region. Therefore, while suppressing an increase in the manufacturing processes, the SOI transistor can be formed and an increase in chip size can be suppressed. Consequently, the SOI transistor can be provided at low cost.

Figure 19A:
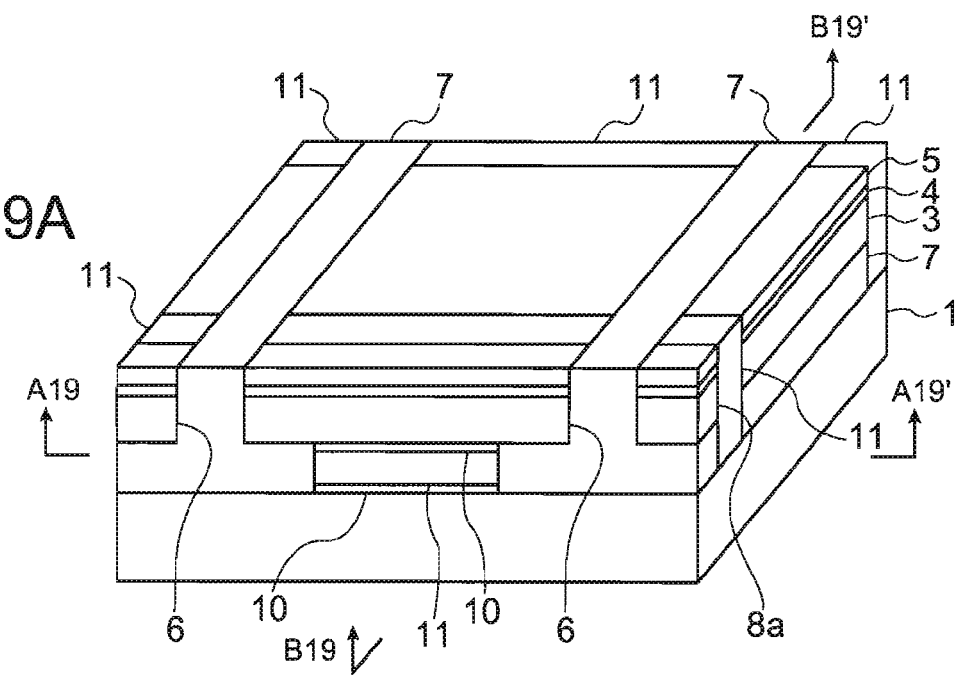
FIGS. 19A to 19C show the method for manufacturing the semiconductor device according to the second embodiment of the invention.
Figure 19B:
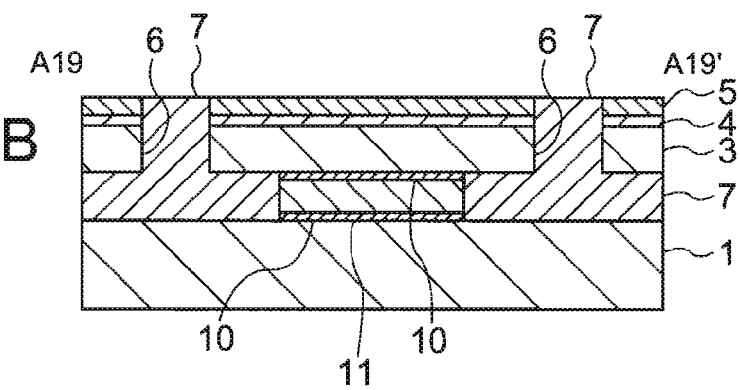
Figure 19C:
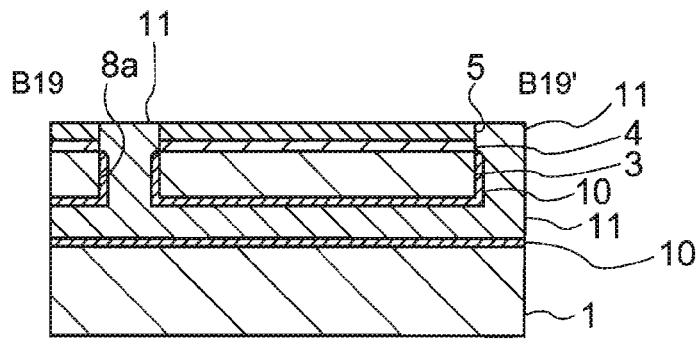

Next, as shown in FIGS. 19A to 19C, using a method such as ALD, MOCVD or CVD, a conductive film is buried in the cavity 9 with the insulating film 10 formed therein, whereby a buried conductive layer 11 is formed in the cavity 9 having the insulating film 10. Then, the buried conductive layer 11 is formed into a thin-film by using CMP, etch-back process or the like to expose the surface of the antioxidant film 5 in the state in which the buried conductive layer 11 has been buried in the cavity 9. Here, arrangement of the antioxidant film 5 allows the film to serve as a stopper layer in the CMP planarization process. The material of the buried conductive layer 11 may be, for example, polycrystalline or amorphous semiconductor, doped with impurity such as B, As or P, or may be one of a metal such as W, Mo, Al, Cu, Ti or Ta and an alloy such as TiN, TaN, silicide or germanosilicide.

In this manner, by using a versatile semiconductor manufacturing process, it is possible to allow the buried conductive layer 11 to serve as a backgate electrode. Furthermore, the buried conductive layer 11 can be formed under the second semiconductor layer 3 while ensuring the implantability of the buried conductive layer 11. Thus, the backgate electrode can be arranged under the SOI transistor while suppressing the complexity of the manufacturing process.

Here, work function, polarity and impurity-concentration may be made different between the semiconductor layer 3 constituting the field-effect transistor and the buried conductive layer 11 serving as the backgate electrode. In this manner, even when a body region of the semiconductor layer 3 is doped intrinsically or at a low concentration, threshold voltage can be changed by approximately a few volts. Thereby, electron mobility of the field-effect transistor can be enhanced and the on-current can be increased. Moreover, since the impurity concentration of the semiconductor layer can be reduced, even when the film thickness of the semiconductor layer increases, a sharp subthreshold slope is obtainable and thereby characteristic variations can be reduced. As a result, due to improvement in manufacturing yield, cost reduction can be achieved.

Furthermore, the support member 7 is formed after etching of the first semiconductor layer 2 has been performed in a lateral direction via the groove 6. In this manner, even when the cavity 9 is formed under the second semiconductor layer 3, it is possible to support the second semiconductor layer 3 not only from the sidewalls thereof but also from thereunder. In addition, the buried conductive layer 11 can be buried partially between the semiconductor substrate 1 and the second semiconductor layer 3, so that the backgate electrode can be arranged under a channel in a manner avoiding the region under the source and drain layers 25a and 25b, as shown in FIGS. 25A to 25C. Therefore, while suppressing the complexity of the manufacturing process, the active region potential of the SOI transistor can be controlled by the backgate electrode, which can improve drain current rising characteristics in a subthreshold region. Moreover, even when the backgate electrode is arranged under the SOI transistor, it is possible to suppress an increase in parasitic capacitance of the source and drain layers 25a and 25b.

Figure 20A:
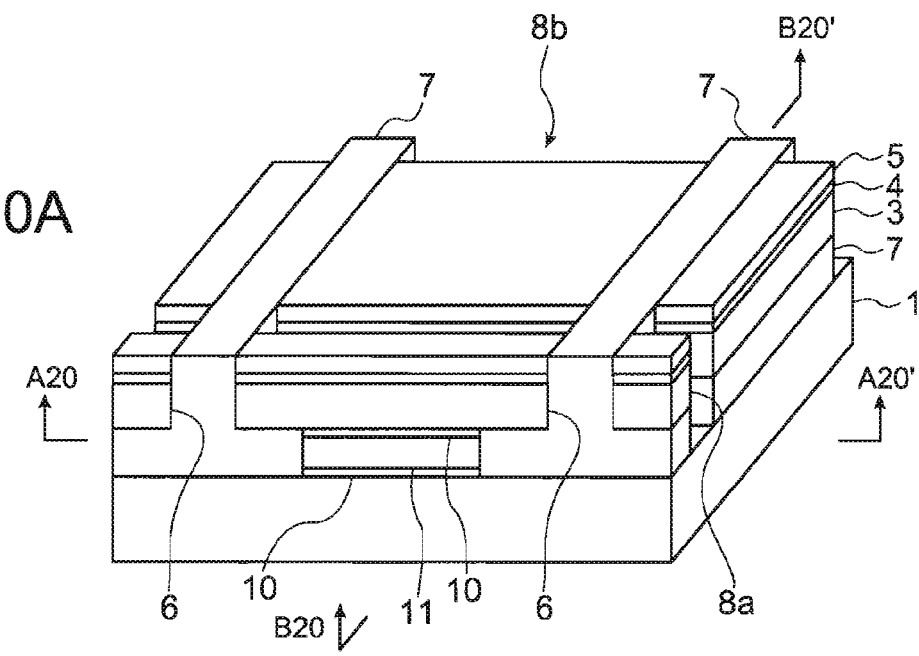
FIGS. 20A to 20C show the method for manufacturing the semiconductor device according to the second embodiment of the invention.
Figure 20B:
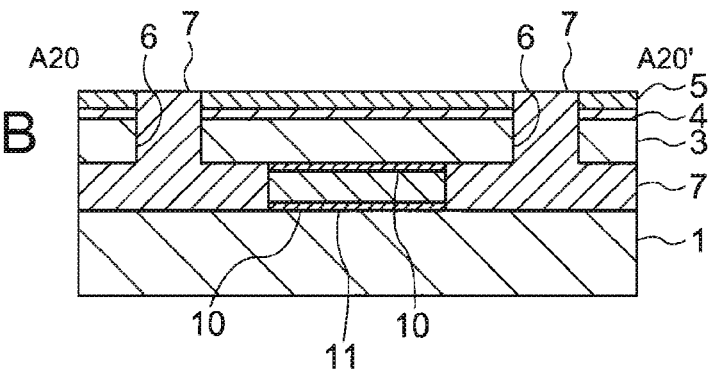
Figure 20C:
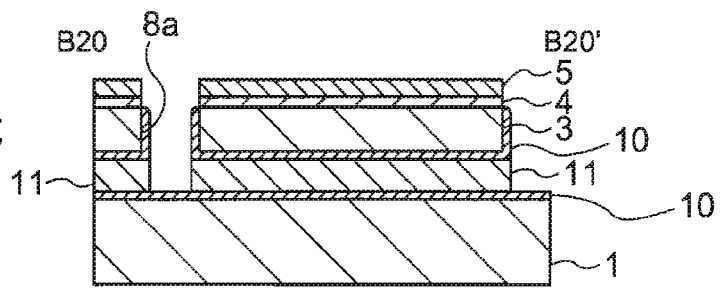

Next, as shown in FIGS. 20A to 20C, the buried conductive layer 11 is selectively etched by using isotropic etching such as wet etching or plasma etching, anisotropic etching, or a combination thereof. In this manner, while leaving the buried conductive layer 11 under the second semiconductor layer 3, the buried conductive layer 11 in the cavity 8a and on the step portion 8b is removed.

Alternatively, the buried conductive layer 11 in the groove 8a and on the step portion 8b may be removed while leaving the buried conductive layer 11 under the second semiconductor layer 3 by simply back-etching an entire surface of the buried conductive layer 11. In this manner, even when the buried conductive layer 11 is deposited on the entire surface of the semiconductor substrate 1 to bury the buried conductive layer 11 in the cavity 9, simply back-etching the entire surface thereof allows an unnecessary conductive layer to be removed while leaving the buried conductive layer 11 in the cavity 9. Thereby, while suppressing the complexity of the manufacturing process, it is possible to arrange the backgate electrode under the SOI transistor.

Still alternatively, thermal oxidation may be performed on the buried conductive layer 11 deposited on the entire surface of the semiconductor substrate 1 to form the buried conductive layer 11 in the groove 8a and on the step portion 8b into an insulating oxide film. For example, when the buried conductive layer 11 is made of polycrystalline silicon, the polycrystalline silicon in the groove 8a and on the step portion 8b can be changed into a silicon oxide film by oxidation.

Figure 21A:
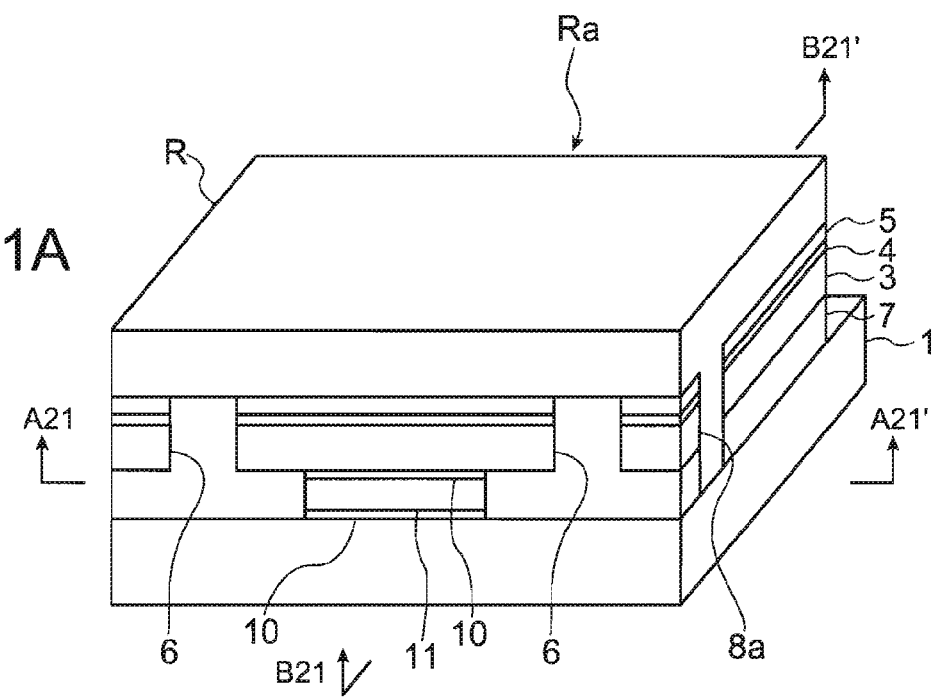
FIGS. 21A to 21C show the method for manufacturing the semiconductor device according to the second embodiment of the invention.
Figure 21B:
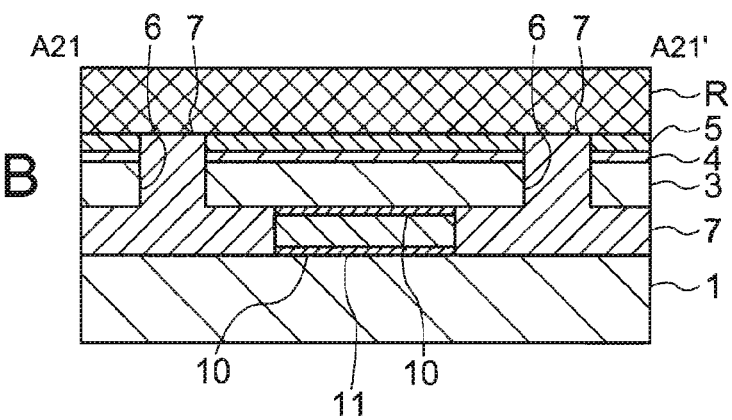
Figure 21C:
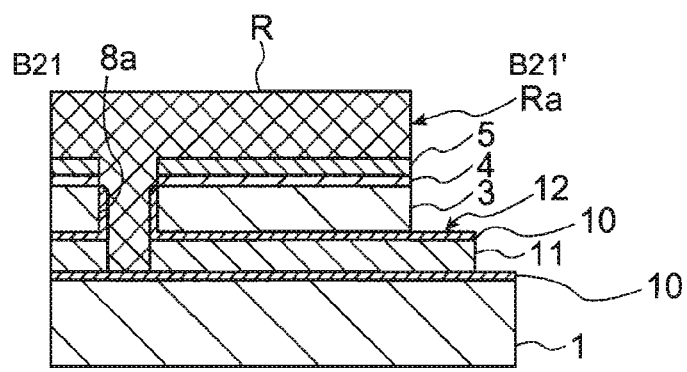

Next, as shown in FIGS. 21A to 21C, a resist pattern R is formed on the antioxidant film 5 by using photolithographic techniques. The resist pattern R has an opening Ra for exposing a top of an end of the buried conductive layer 11. Then, using the resist pattern R as a mask, etching is performed on the antioxidant film 5, the base oxide film 4 and the second semiconductor layer 3, thereby exposing the insulating film 10 on the end of the buried conductive layer 11.

Figure 22A:
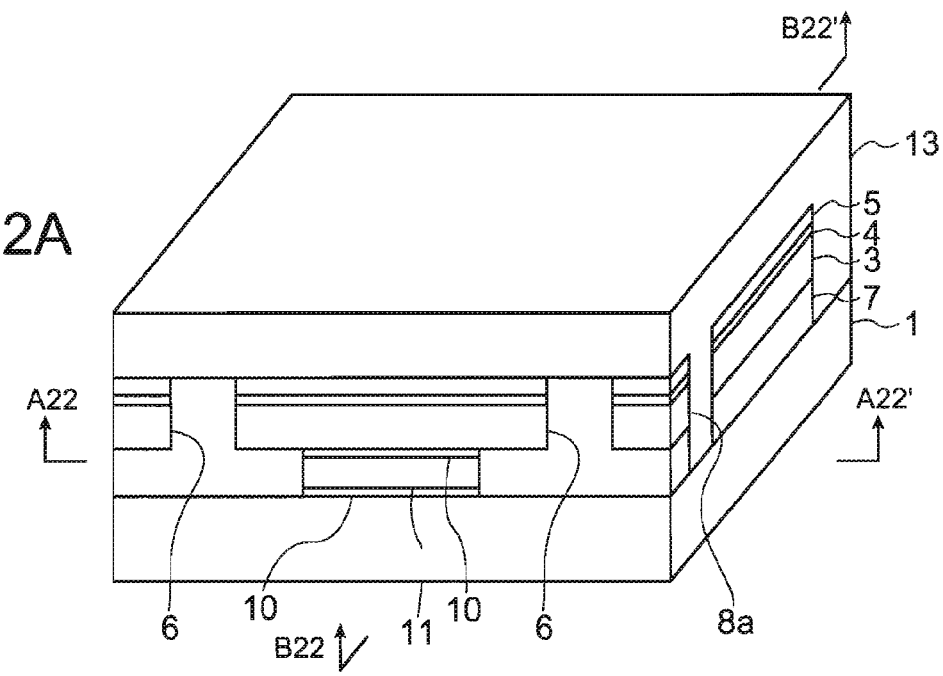
FIGS. 22A to 22C show the method for manufacturing the semiconductor device according to the second embodiment of the invention.
Figure 22B:
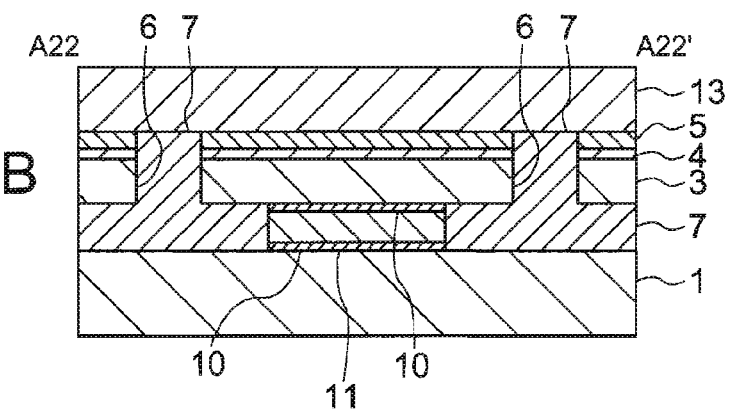
Figure 22C:
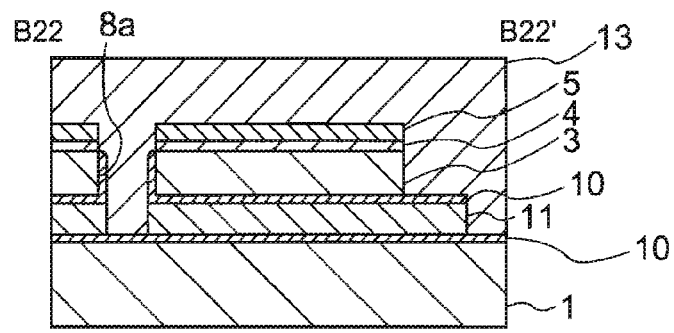

Next, as shown in FIGS. 22A to 22C, a buried insulator 13 is film-formed to be buried in the groove 8a and on the step portion 8b in a manner covering the entire surface of the antioxidant film 5 by using a method such as CVD. The buried insulator 13 may be an insulator such as a silicon oxide film or a silicon nitride film, for example.

Figure 23A:
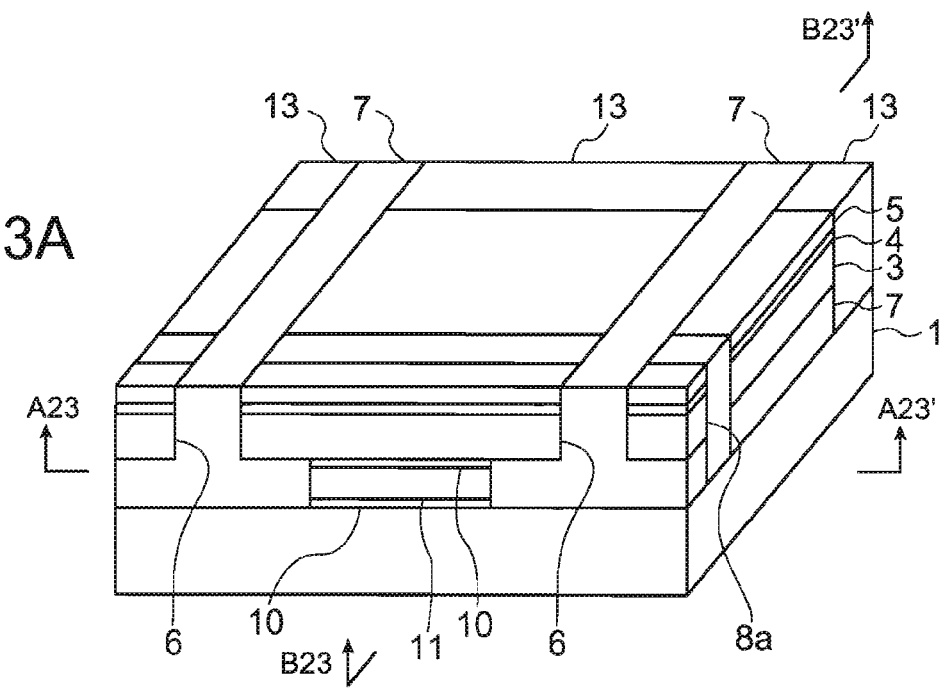
FIGS. 23A to 23C show the method for manufacturing the semiconductor device according to the second embodiment of the invention.
Figure 23B:
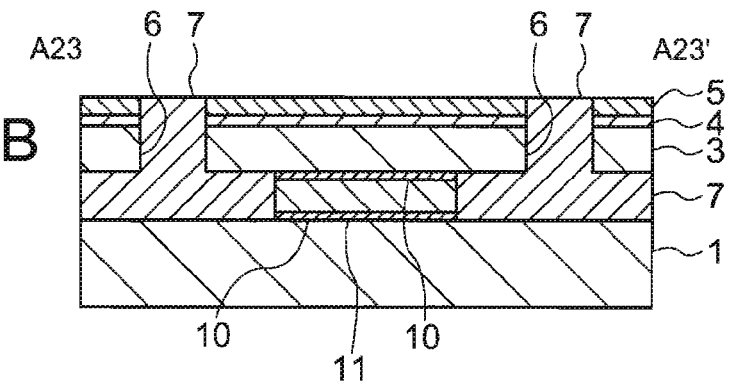
Figure 23C:
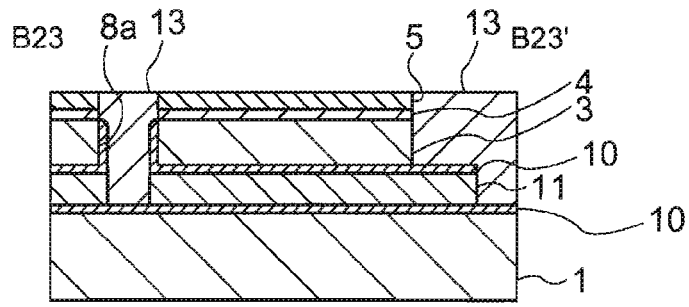
Figure 24A:
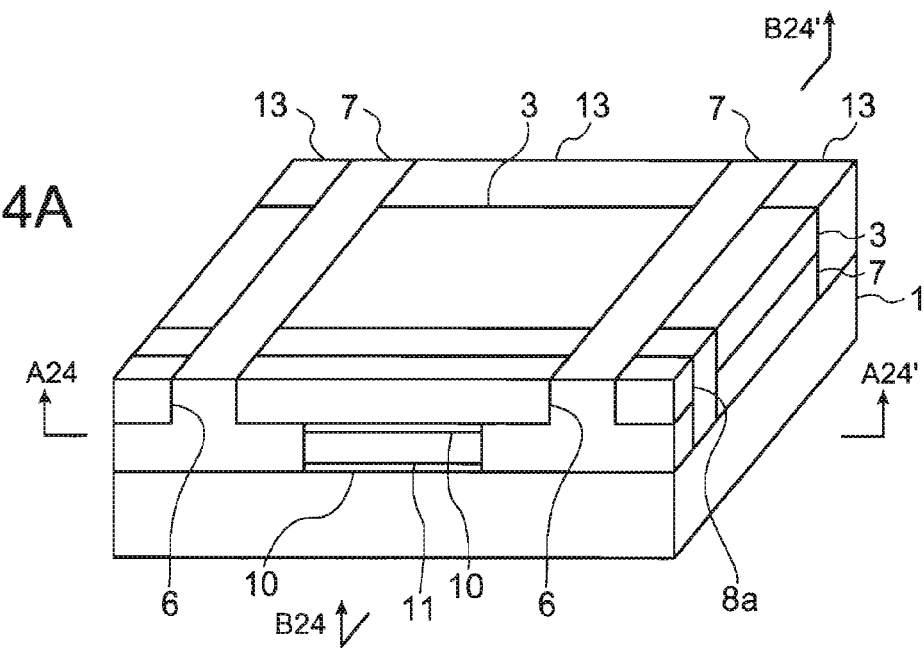
FIGS. 24A to 24C show the method for manufacturing the semiconductor device according to the second embodiment of the invention.
Figure 24B:
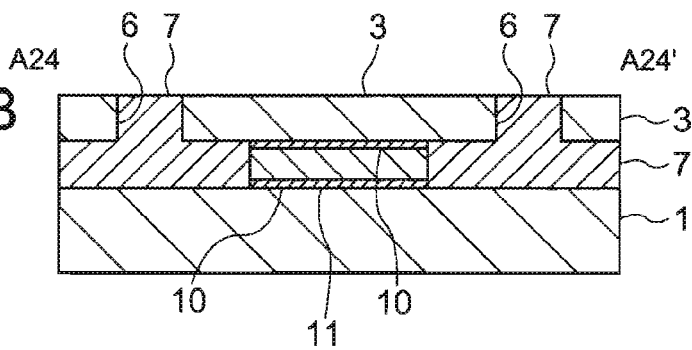
Figure 24C:
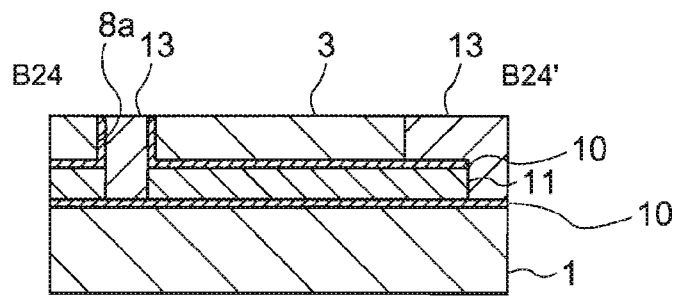

Next, as shown in FIGS. 23A to 23C, the buried insulator 13 is formed into a thin film by using CMP, etching back process or the like, where the antioxidant film 5 is used as a stopper layer to stop the CMP planarization. Sequentially, as shown in FIGS. 24A to 24C, the base oxide film 4 and the antioxidant film 5 are removed to expose the surface of the second semiconductor layer 3.

Next, as shown in FIGS. 25A to 25C, thermal oxidation of the surface of the second semiconductor layer 3 allows a gate insulating film 21 to be formed on the surface of the second semiconductor layer 3. The gate insulating film 21 may be a silicon nitride film or a high-K insulating film such as an Hf or Zr oxide film, which can be formed by using ALD or CVD techniques, and a film thickness or a relative dielectric constant of the gate insulating film 21 may be made different from that of the insulating film 10. In this manner, while the buried conductive layer 11 can be arranged under the field-effect transistor, it is possible to increase coupling capacitance between the buried conductive layer 11 and the channel region and decrease parasitic capacitance between the buried conductive layer 11 and the source and drain layers 25a and 25b. Accordingly, the buried conductive layer 11 can be arranged without restrictions by the arrangements of the gate electrode 22, the source and drain contact electrodes 27a and 27b or the like. Additionally, threshold controllability by the buried conductive layer 11 can be improved, whereby the transistor operating and standby power consumption can be reduced and high-speed performance of the SOI transistor can be achieved. Furthermore, when the insulating film 10 is a thin silicon oxide film or a thin silicon nitride film having a film thickness ranging from 1 nm to 20 nm, or a high-K insulating film, which is an oxide film of metal such as AL, Zr or Hr, threshold controllability by the buried conductive layer 11 can be improved. Therefore, favorable subthreshold characteristics can be obtained.

Then, using a method such as CVD, a polycrystalline silicon layer is formed on the second semiconductor layer 3 having the gate insulating film 21 formed thereon. Next, the polycrystalline silicon layer is patterned by using photolithography and etching techniques to form a gate electrode 22 on the second semiconductor layer 3. Here, when forming the gate electrode 22 on the second semiconductor layer 3, the gate electrode 22 may be arranged avoiding an area above an end of the buried conductive layer 11. Additionally, the buried conductive layer 11 may have a work function different from that of the gate electrode 22. For example, the buried conductive layer 11 may be made of a material among polycrystalline semiconductor, amorphous semiconductor, silicide and metal, the material having N or P polarity, whereas the gate electrode 21 may be made of a material among polycrystalline semiconductor, amorphous semiconductor, silicide and a metal gate having a work function different from that of the buried conductive layer 11, the material having N or P polarity. In this manner, combining the polarities and impurity concentrations of the buried conductive layer 11 and the gate electrode 22 allows the threshold of the field-effect transistor to be adjusted while maintaining channel-impurity concentration at a low level. Therefore, regardless of the threshold level, electron mobility of the field-effect transistor can be enhanced and thereby the on-current can be increased. Furthermore, even when the second semiconductor layer 3 is formed into a thick film, a sharp subthreshold slope can be obtained, whereby characteristic variations can be reduced.

Next, using the gate electrode 22 as a mask, an impurity such as, P or B is introduced into the second semiconductor layer 3 by ion implantation. Thereby, lightly doped drain (LDD) layers 23a and 23b comprised of low-concentration impurity layers are formed on the second semiconductor layer 3 to be arranged respectively on opposite lateral sides of the gate electrode 22. Then, an insulation layer is formed on the second semiconductor layer 3 having the LDD layers 23a and 23b by using a method such as CVD, and the insulating layer is etch-backed by using an anisotropic etching technique such as reactive ion etching (RIE) to form sidewalls 24a and 24b on sidewalls of the gate electrode 22. Next, using the gate electrode 22 and the sidewalls 24a and 24b as a mask, an impurity such as, P or B is ion-implanted into the second semiconductor layer 3 to form the source and drain layers 25a and 25b on the second semiconductor layer 3. The layers 25a and 25b are made of high-concentration impurity layers and arranged, respectively, on opposite lateral sides of the sidewalls 24a and 24b.

Figure 26A:
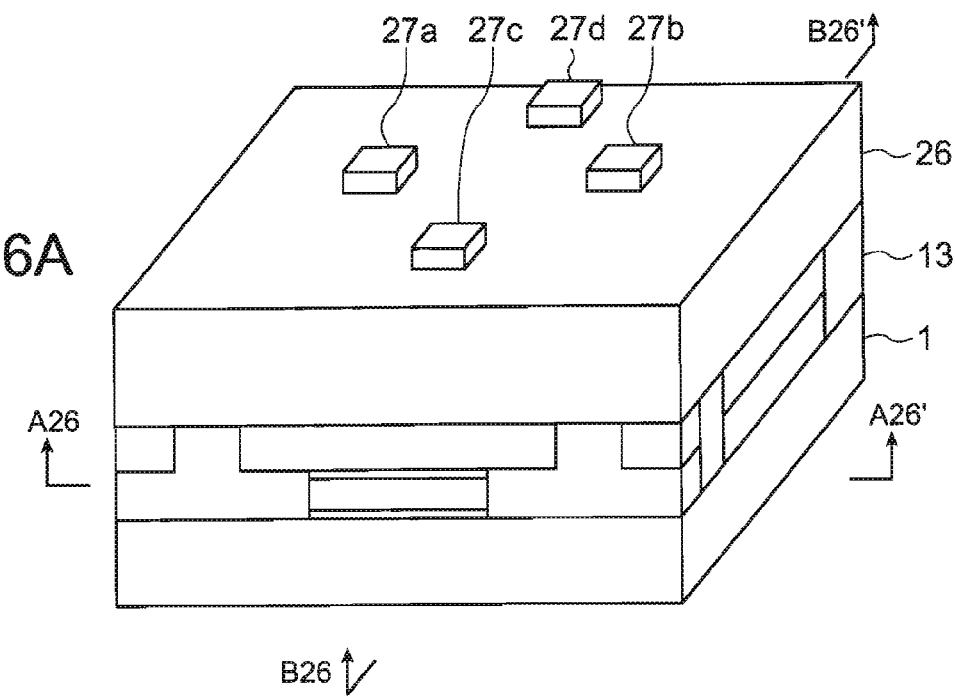
FIGS. 26A to 26C show the method for manufacturing the semiconductor device according to the second embodiment of the invention.
Figure 26B:
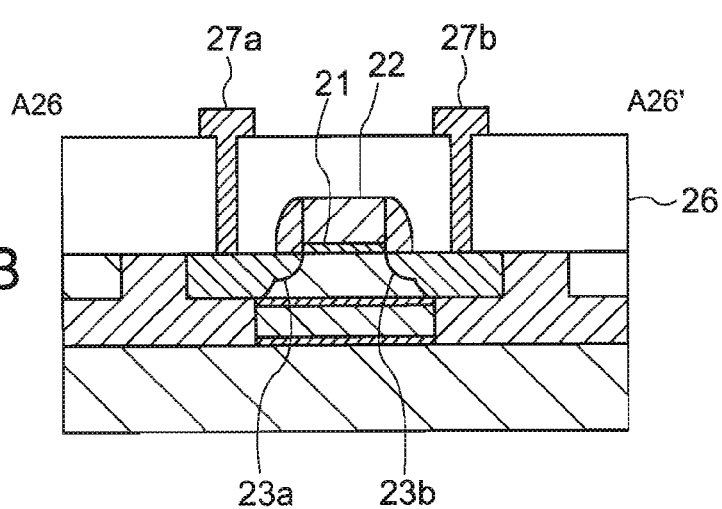
Figure 26C:
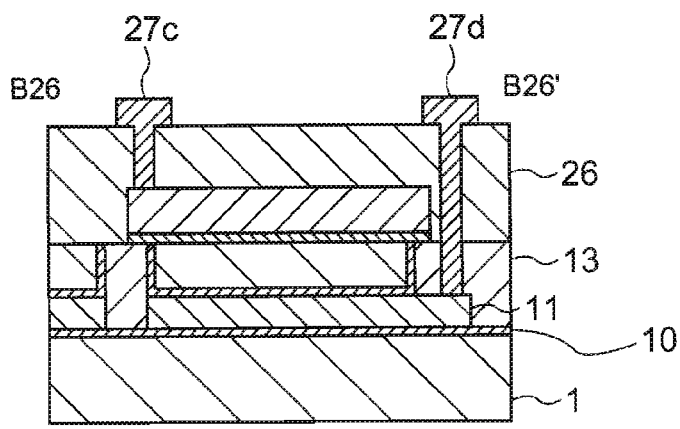

Next, as shown in FIGS. 26A to 26C, an interlayer insulating layer 26 is deposited on the gate electrode 22 by using a method such as CVD. Then, a backgate contact electrode 27d is formed thereon. The backgate contact electrode 27d is buried in the interlayer insulating layer 26 and the buried insulator 13 to be connected to the buried conductive layer 11. In addition, a source contact electrode 27a, a drain contact electrode 27b and a gate contact electrode 27c are formed on the interlayer insulating layer 26. The source and drain contact electrodes 27a, 27b and the gate contact electrode 27c are buried in the interlayer insulating layer 26 to be connected to the source and drain layers 25a, 25b and the gate electrode 22, respectively.

In this manner, while reducing the occurrence of defects in the second semiconductor layer 3, the SOI transistor can be formed at the second semiconductor layer 3. Additionally, the backgate electrode can be arranged under the channel in a manner avoiding the region under the source and drain layers 25a and 25b of the SOI transistor. Accordingly, while suppressing the complexity of the manufacturing process, an active region potential of the SOI transistor can be controlled by the backgate electrode, as well as drain-current rising characteristics in a subthreshold region can be improved. Moreover, even when the backgate electrode is arranged under the SOI transistor, it is possible to suppress an increase in parasitic capacitance of the source and drain layers 25a and 25b. Consequently, while suppressing a cost increase, the on-current can be increased and high-speed performance of the SOI transistor can be achieved. Also, while allowing low voltage operation, an off-period leakage current can be reduced. Thereby, the operating and standby power consumption can be reduced.

In addition, the gate electrode 22 is arranged so as to avoid the region above the edge of the buried conductor layer 11. Therefore, even when the buried conductive layer 11 is arranged under the field-effect transistor so as to be positioned coincidentally with the channel region of the field-effect transistor, contact with the buried conductive layer 11 is obtainable without being obstructed by the gate electrode 22. Accordingly, a potential of the buried conductive layer 11 can be controlled externally.

In addition, the gate electrode 22 may be electrically connected to the buried conductive layer 11 via the gate contact electrode 27c and the backgate contact electrode 27d. In this manner, control can be made such that the backgate electrode can have the same potential as that of the gate electrode 22. Thereby, controllability to potential of the channel region can be enhanced, which allows the drain current in the subthreshold region to rise exponentially. Consequently, while suppressing an increase in chip size, the off-time period leakage current can be reduced, so that the operating and standby power consumption of the transistor can be reduced and the field-effect transistor can have a high breakdown voltage.

Alternatively, the source layer 25a may be electrically connected to the buried conductive layer 11 via the source contact electrode 27a and the backgate contact electrode 27d, or the potential of the buried conductive layer 11 may be controlled independently from the backgate electrode and the gate electrode 22.

In addition, in the embodiment described above, when forming the insulating film 10, in order to prevent thermal oxidation on the surface of the second semiconductor layer 3, the description has been given of the method for forming the antioxidant film 5 on the second semiconductor layer 3. However, instead of forming the antioxidant film 5 thereon, the insulating film 10 may be formed. In this case, the insulating film formed on the surface of the second semiconductor layer 3 when forming the insulating film 10 may be removed by etching or polishing.

Although the invention has been described with reference to particular embodiments, workers skilled in the art will recognize that changes may be made in form and detail without departing from the spirit and scope of the invention, which is defined by the appended claims.

What is claimed is:

1. A semiconductor device, comprising:
   a first insulator formed at a part under a semiconductor layer;
   a second insulator formed under the semiconductor layer in an arranged manner avoiding the first insulator and having a relative dielectric constant different from that of the first insulator;
   a backgate electrode formed under the first and second insulators;
   a gate electrode formed on the semiconductor layer;
   a source layer and a drain layer formed in the semiconductor layer to be respectively arranged on opposite lateral sides of the gate electrode, and
   a wiring layer for electrically connecting the source layer to the backgate electrode.

2. The semiconductor device according to claim 1, further comprising a wiring layer for connecting the backgate electrode to the gate electrode.

3. A semiconductor device comprising:
   a semiconductor layer formed on a semiconductor substrate by epitaxial growth;
   a buried conductive layer buried partially between the semiconductor substrate and the semiconductor layer to be sandwiched between upper and lower insulating layers; and
   a field-effect transistor formed at the semiconductor layer in such a manner that a channel is arranged above the buried conductive layer,
   wherein the buried conductive layer has an extending portion extended in a width direction thereof longer than a gate electrode of the field-effect transistor and also has a backgate contact electrode connected to the buried conductive layer via the extending portion.

4. The semiconductor device according to claim 3, further comprising a support member arranged so as to reach under a source layer and a drain layer of the field-effect transistor in a manner sandwiching the buried conductive layer from both lateral sides thereof via sidewalls of the semiconductor layer to support the semiconductor layer on the semiconductor substrate.

5. The semiconductor device according to claim 3, wherein the upper and lower insulating layers are a thermally-oxidized film, an oxynitride film or a high-K insulating film, whereas the buried conductive layer is comprised of impurity-doped polycrystalline semiconductor, amorphous semiconductor, metal or alloy.

6. The semiconductor device according to claim 3, wherein the buried conductive layer has a work function different from that of the gate electrode of the field-effect transistor.

7. The semiconductor device according to claim 3, wherein there is a difference in a film thickness or a relative dielectric constant between the upper and lower insulating layers and the gate insulating film of the field-effect transistor.

8. The semiconductor device according to claim 3, further comprising a wiring layer for electrically connecting the gate electrode of the field-effect transistor to the buried conductive layer.

9. The semiconductor device according to claim 3, further comprising a wiring layer electrically connected to the buried conductive layer in a manner independent from the gate electrode and a source layer of the field-effect transistor.

10. The semiconductor device according to claim 3, wherein the buried conductive layer is comprised of a material among polycrystalline semiconductor, amorphous semiconductor, silicide and metal, the material having N or P polarity, whereas the gate electrode of the field-effect transistor is comprised of a material among polycrystalline semiconductor, amorphous semiconductor, suicide and a metal gate with a work function different from that of the buried conductive layer, the material having N or P polarity.

11. A semiconductor device comprising:
a semiconductor layer formed on a semiconductor substrate by epitaxial growth;
a buried conductive layer buried partially between the semiconductor substrate and the semiconductor layer to be sandwiched between upper and lower insulating layers;
a field-effect transistor formed at the semiconductor layer in such a manner that a channel is arranged above the buried conductive layer; and
a wiring layer for electrically connecting a source layer of the field-effect transistor to the buried conductive layer.

12. The semiconductor device according to claim 11, further comprising a support member arranged so as to reach under the source layer and a drain layer of the field-effect transistor in a manner sandwiching the buried conductive layer from both lateral sides thereof via sidewalls of the semiconductor layer to support the semiconductor layer on the semiconductor substrate.

13. The semiconductor device according to claim 11, wherein the upper and lower insulating layers are a thermally-oxidized film, an oxynitride film or a high-K insulating film, whereas the buried conductive layer is comprised of impurity-doped polycrystalline semiconductor, amorphous semiconductor, metal or alloy.

14. The semiconductor device according to claim 11, wherein the buried conductive layer has a work function different from that of a gate electrode of the field-effect transistor.

15. The semiconductor device according to claim 11, wherein there is a difference in a film thickness or a relative dielectric constant between the upper and lower insulating layers and a gate insulating film of the field-effect transistor.

16. The semiconductor device according to claim 11, further comprising a wiring layer for electrically connecting a gate electrode of the field-effect transistor to the buried conductive layer.

17. The semiconductor device according to claim 11, further comprising a wiring layer electrically connected to the buried conductive layer in a manner independent from a gate electrode and the source layer of the field-effect transistor.

18. The semiconductor device according to claim 11, wherein the buried conductive layer is comprised of a material among polycrystalline semiconductor, amorphous semiconductor, silicide and metal, the material having N or P polarity, whereas a gate electrode of the field-effect transistor is comprised of a material among polycrystalline semiconductor, amorphous semiconductor, silicide and a metal gate with a work function different from that of the buried conductive layer, the material having N or P polarity.

* * * * *